(12) United States Patent
Watanabe et al.

(10) Patent No.: US 7,885,305 B2
(45) Date of Patent: Feb. 8, 2011

(54) SEMICONDUCTOR LASER DEVICE AND SEMICONDUCTOR LASER DEVICE ARRAY

(75) Inventors: Akiyoshi Watanabe, Hamamatsu (JP); Hirofumi Miyajima, Hamamatsu (JP); Hirofumi Kan, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 418 days.

(21) Appl. No.: 11/659,198

(22) PCT Filed: Aug. 4, 2005

(86) PCT No.: PCT/JP2005/014321

§ 371 (c)(1),
(2), (4) Date: May 9, 2008

(87) PCT Pub. No.: WO2006/013935

PCT Pub. Date: Feb. 9, 2006

(65) Prior Publication Data

US 2009/0022194 A1    Jan. 22, 2009

(30) Foreign Application Priority Data

Aug. 5, 2004  (JP) .......................... P2004-229858

(51) Int. Cl.
*H01S 5/00* (2006.01)

(52) U.S. Cl. .............. 372/45.01; 372/43.01; 372/50.12; 372/92

(58) Field of Classification Search .............. 372/43.01, 372/49.01, 50.12, 92–102, 45.01
See application file for complete search history.

(56) References Cited

U.S. PATENT DOCUMENTS 4,821,277 A * 4/1989 Alphonse et al. ......... 372/45.01

(Continued)

FOREIGN PATENT DOCUMENTS

JP          55-11400          1/1980

(Continued)

*Primary Examiner*—Minsun Harvey
*Assistant Examiner*—Xnning Niu
(74) *Attorney, Agent, or Firm*—Drinker Biddle & Reath LLP

(57) ABSTRACT

In an active layer 15 of a semiconductor laser device 3, a refractive index type main waveguide 4 is formed by a ridge portion 9a of a p-type clad layer 17. Side surfaces 4g and 4h of the main waveguide 4 form a relative angle θ, based on a total reflection critical angle θc at the side surfaces 4g and 4h, with respect to a light emitting surface 1a and a light reflecting surface 1b. The main waveguide 4 is separated by predetermined distances from the light emitting surface 1a and the light reflecting surface 1b, and optical path portions 8a and 8b, for making a laser light L1 pass through, are disposed between one end of the main waveguide 4 and the light emitting surface 1a and between the other end of the main waveguide 4 and the light reflecting surface 1b. The optical path portions 8a and 8b are gain type waveguides and emit light components L2 and L3, which, among the light passing through the optical path portions 8a and 8b, deviate from a direction of a predetermined axis A, to the exterior. A semiconductor laser device and a semiconductor laser device array that can emit laser light of comparatively high intensity and can reduce side peaks are thereby realized.

9 Claims, 23 Drawing Sheets

U.S. PATENT DOCUMENTS

| | | | |
|---|---|---|---|
| 4,958,355 A * | 9/1990 | Alphonse et al. | 372/45.01 |
| 4,965,525 A | 10/1990 | Zah | |
| 6,542,529 B1 | 4/2003 | Hagberg et al. | |
| 6,804,281 B1 * | 10/2004 | Walpole et al. | 372/45.01 |
| 2005/0030995 A1 * | 2/2005 | Kawakami et al. | 372/43 |
| 2007/0258496 A1 | 11/2007 | Miyajima et al. | |

FOREIGN PATENT DOCUMENTS

| | | |
|---|---|---|
| JP | 2-214181 | 8/1990 |
| JP | 4-48792 | 2/1992 |
| JP | 4-243216 | 8/1992 |
| JP | 5-27130 | 2/1993 |
| JP | 5-501938 | 4/1993 |
| JP | 8-211342 | 8/1996 |
| JP | 9-307181 | 11/1997 |
| JP | 10-41582 | 2/1998 |
| JP | WO 00/48277 | 8/2000 |
| JP | 2001-185810 | 7/2001 |
| JP | 2004-214226 | 7/2004 |

* cited by examiner

Fig.2
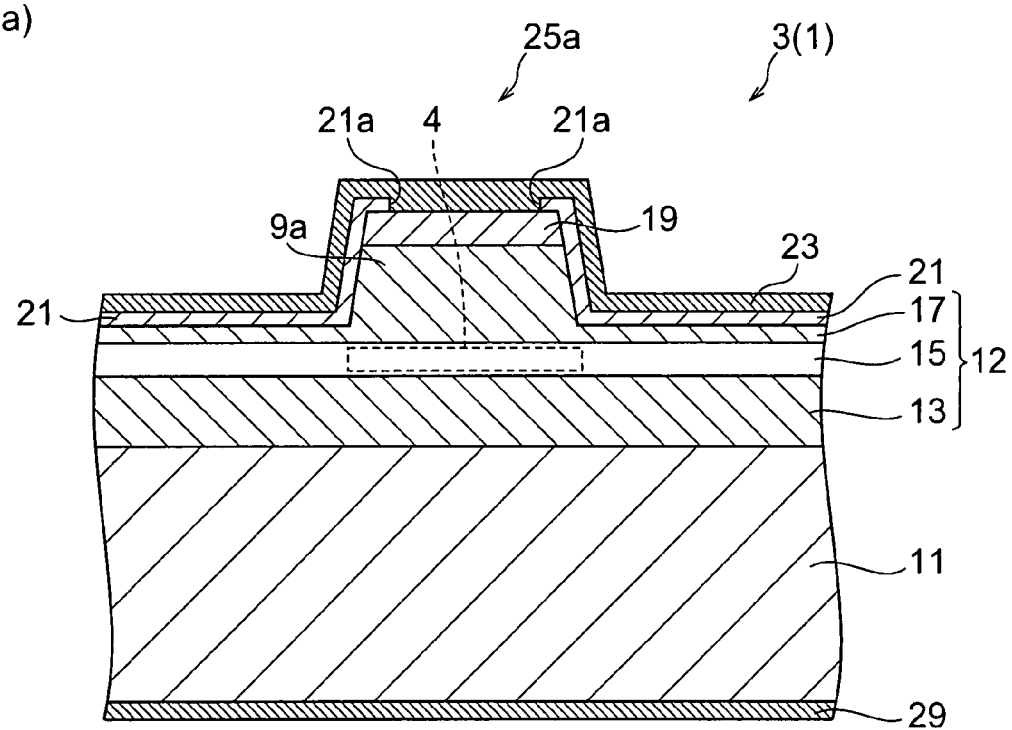
(a)
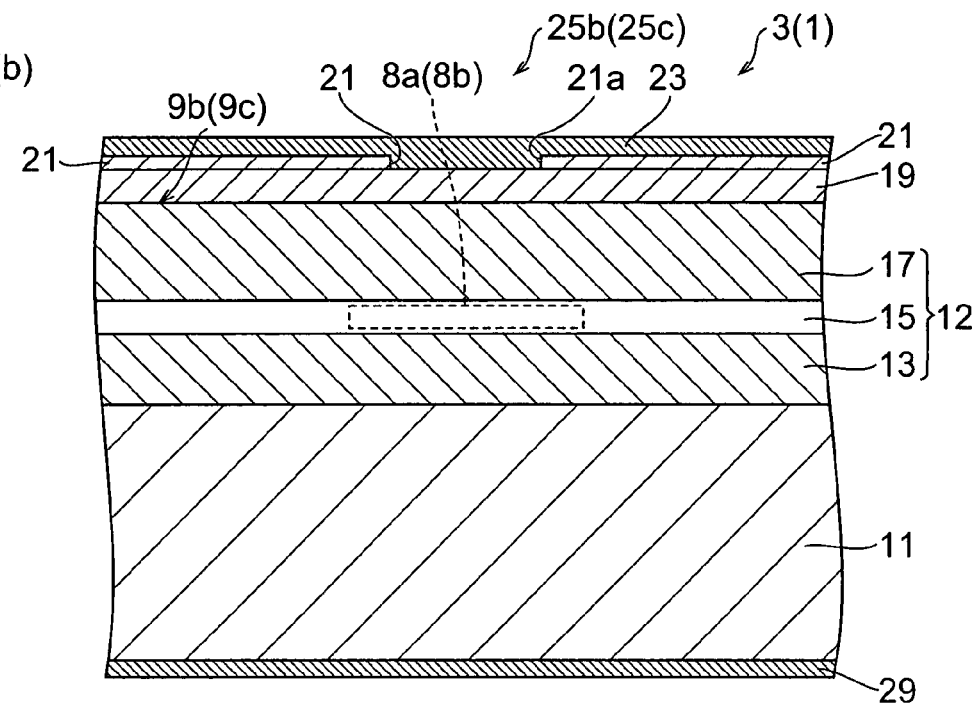
(b)

Fig.8
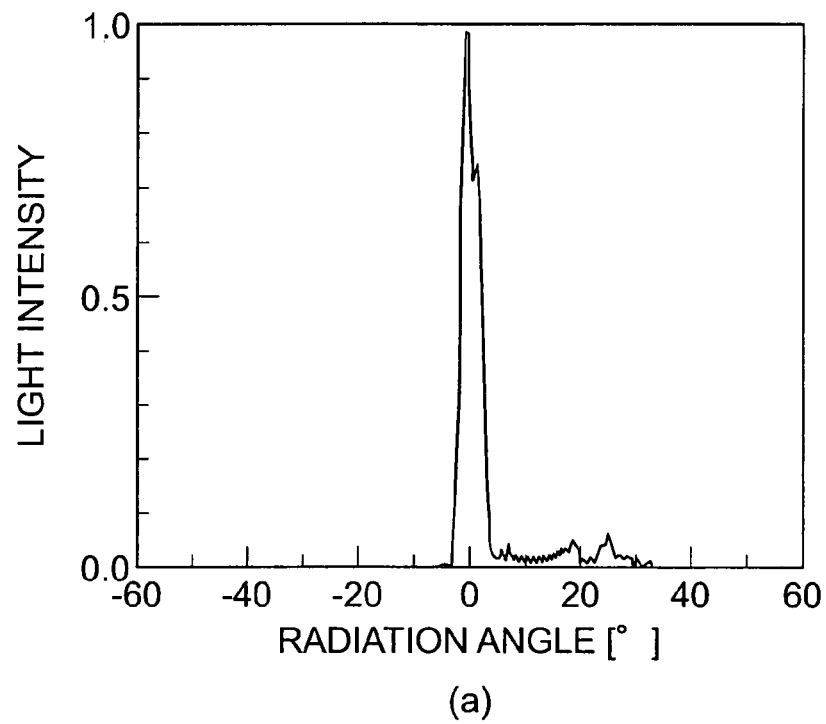
(a)
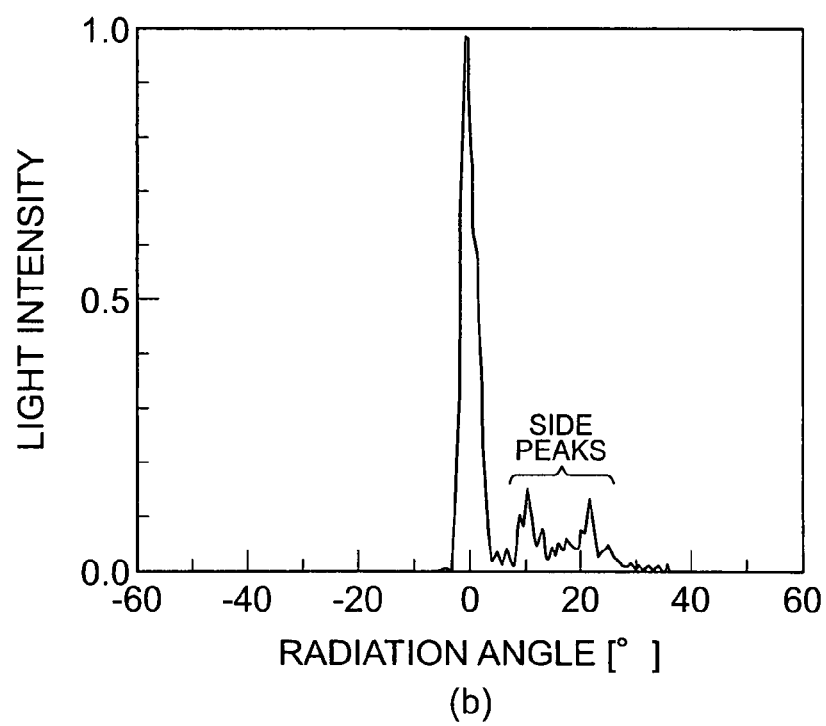
(b)

Fig.9
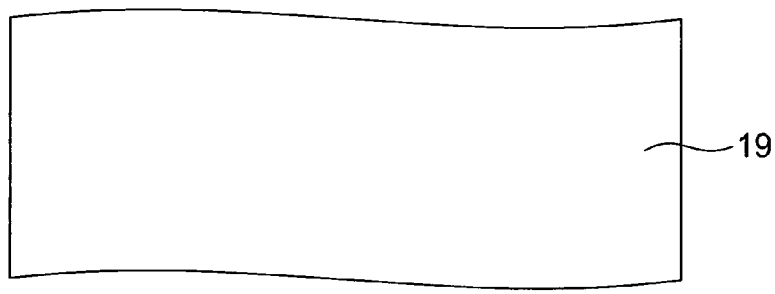
(a)
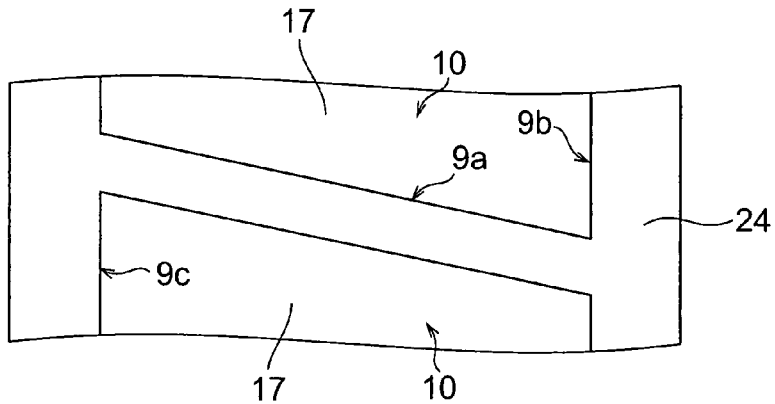
(b)
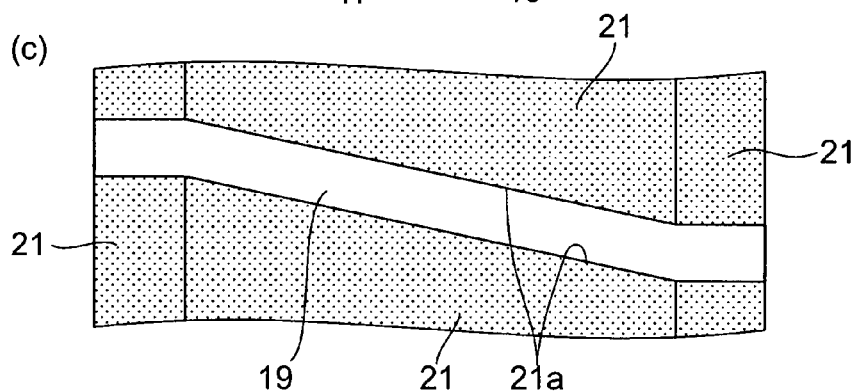
(c)
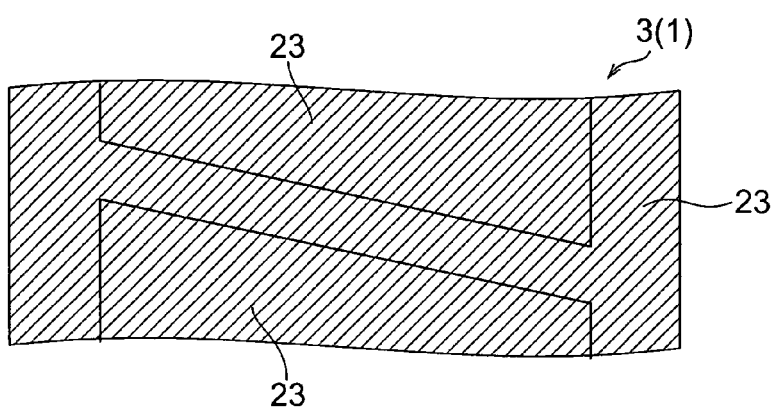
(d)

Fig.23
(a)
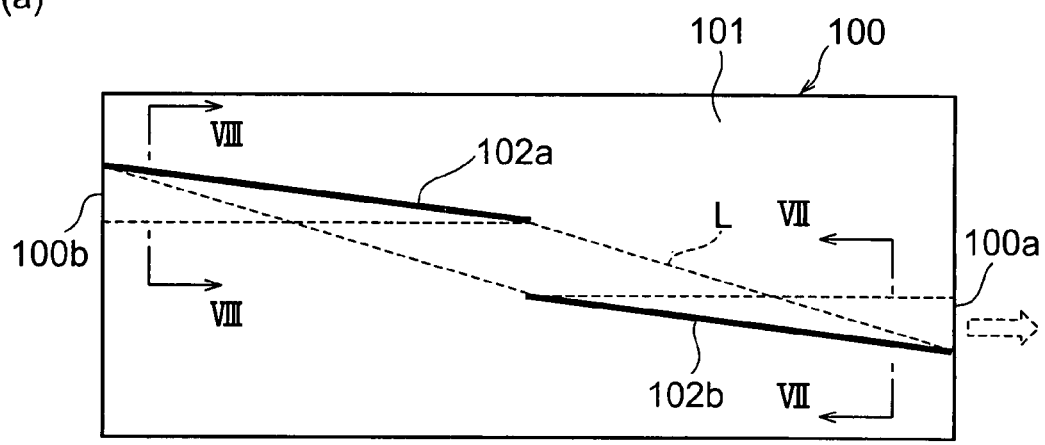
(b)
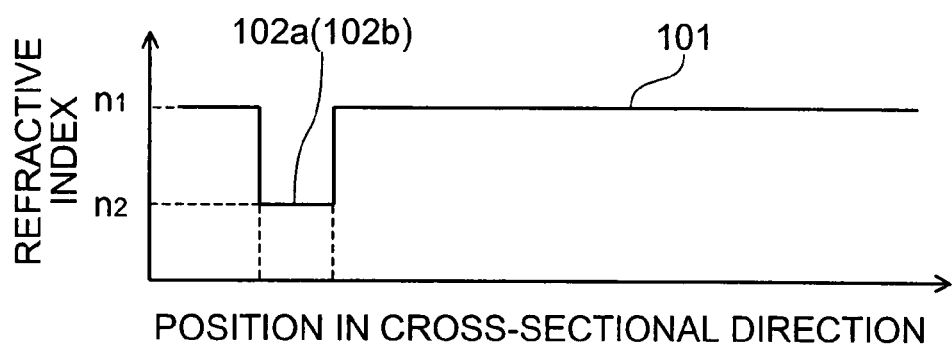
POSITION IN CROSS-SECTIONAL DIRECTION

SEMICONDUCTOR LASER DEVICE AND SEMICONDUCTOR LASER DEVICE ARRAY

TECHNICAL FIELD

The present invention relates to a semiconductor laser device and a semiconductor laser device array.

BACKGROUND ART

Spatial transverse single-mode and multi-mode structures have been known as structures of conventional semiconductor laser devices. Among these, with a single-mode type semiconductor laser device, a waveguide is formed to be narrow in width to restrict the oscillation mode within the waveguide to a single-mode. However, when the width of the waveguide is narrow, an emission end is also made small in area. Also, when the laser light density at the emission end is excessive, the reliability, etc., of the semiconductor laser device are affected. Single-mode type semiconductor laser devices are thus favorably employed in applications using laser light of comparatively low output. As an example of a single-mode type semiconductor laser device, there is the semiconductor laser apparatus disclosed in Patent Document 1. With this semiconductor laser apparatus, the width of a waveguide in a single-mode type semiconductor laser is expanded to increase the laser light intensity.

Meanwhile, with a multi-mode type semiconductor laser device, because a plurality of modes may coexist inside a waveguide, the waveguide can be formed to be wide in width. An emission end can thus be made large in area and laser light of comparatively high intensity can be emitted. Such multi-mode type semiconductor laser devices are favorably employed in applications requiring laser light of comparatively high output.

However, multi-mode type semiconductor laser devices have the following problems. That is, because a plurality of modes coexist inside the waveguide, the emission pattern of a laser light emitted from the emission end is disordered and the emission angle is comparatively large. A lens for converging or collimating this laser light thus becomes complex in shape, and there may be thus the demerit that the desired laser light may not be obtained or the lens is expensive.

As an art for resolving the above problem of multi-mode semiconductor laser devices, there is, for example, the resonator disclosed in Patent Document 2. FIG. 23($a$) is a plan view of an arrangement of this resonator. This resonator 100 has two regions 102$a$ and 102$b$ inside an active layer 101. FIG. 23($b$) is a diagram of a refractive index distribution in a section taken on line VII-VII or line VIII-VIII of FIG. 23($a$). As shown in FIG. 23($b$), the refractive index $n_2$ of the regions 102$a$ and 102$b$ is less than the refractive index $n_1$ of other regions of the active layer 101. Also, the regions 102$a$ and 102$b$ are formed inside the active layer 101 at an angle at which a light L, reflected perpendicularly at an emission end 100$a$ and a reflecting end 100$b$, is totally reflected by side surfaces of the regions 102$a$ and 102$b$. In the Patent Document 2, this arrangement is used to restrict the optical paths of the light L that resonates inside the active layer 101 to realize single-mode oscillation without restricting the waveguide width.

Patent Document 1: Japanese Patent Application Laid-Open No. H10-41582

Patent Document 2: International Patent Publication Pamphlet No. 00/48277

DISCLOSURE OF THE INVENTION

Problems to be Solved by the Invention

However, the resonator 100 disclosed in the Patent Document 2 has the following problem. As mentioned above, with the arrangement of the resonator 100, the optical paths of the light L that resonates inside the active layer 101 can be restricted in theory. However, it is known that in actuality in a far-field pattern of emitted light, peaks (referred to hereinafter as "side peaks") of non-negligible magnitudes appear in directions deviating by certain angles from the emission direction. It is thus considered that not just the optical path shown in (a) in FIG. 23, but optical paths, extending along the side surfaces of the regions 102$a$ and 102$b$, or optical paths, along which reflection occurs at just one of the side surfaces among the side surfaces of the regions 102$a$ and 102$b$, are also present in the interior of the active layer 101 of the resonator 100 disclosed in the Patent Document 2. When such side peaks occur in directions deviating from the predetermined emission direction, the emission efficiency of the device is lowered because a part of light resonating in the active layer is not used effectively. The side peak light also becomes scattered at a converging lens and thereby causes degradation of the device.

The present invention has been made in view of the above problems, and an object thereof is to provide a semiconductor laser device and a semiconductor laser device array that can emit laser light of comparatively high intensity and can reduce side peaks.

Means for Solving the Problems

To achieve the above object, a semiconductor laser device according to the present invention includes: a first conductive type clad layer; a second conductive type clad layer; an active layer, disposed between the first conductive type clad layer and the second conductive type clad layer; a light emitting surface and a light reflecting surface, disposed so as to oppose each other in a predetermined axial direction; a refractive index type main waveguide, formed in the active layer, having a pair of side surfaces, and making a laser light resonate between the light emitting surface and the light reflecting surface; and an optical path portion, disposed at least at one of either between the light emitting surface and one end of the main waveguide or between the light reflecting surface and the other end of the main waveguide, a relative angle θ of the pair of side surfaces of the main waveguide with respect to the light emitting surface and the light reflecting surface is based on a total reflection critical angle θc at the pair of side surfaces, and the optical path portion is arranged in a manner such that light deviating from the predetermined axial direction in the optical path portion is emitted from a region, differing from a resonance end face for the laser light, at least at one surface among the light emitting surface and the light reflecting surface.

With the above-described semiconductor laser device, the relative angle θ, of the side surfaces of the main waveguide with respect to the light emitting surface and the light reflecting surface, is based on the total reflection critical angle θc at the side surfaces. Because light that is made incident on a side surface of the main waveguide at an incidence angle less than the total reflection critical angle θc is transmitted through the side surface and exits out of the waveguide, the optical paths of light resonating inside the main waveguide are restricted to optical paths along which light is made incident on the side surfaces of the main waveguide at incidence angles no less than the total reflection critical angle θc and is reflected substantially perpendicularly at the light emitting surface and the light reflecting surface. Because the optical paths of the resonating laser light are thus restricted in terms of the structure of the main waveguide, the angular components of light involved in laser oscillation inside the main waveguide are restricted. The wave-guided light is thus matched in phase and oscillation of a single-mode or close to a single-mode occurs. Thus, with the above-described semiconductor laser device, because the width of the waveguide is not restricted as in a single-mode structure, the waveguide width can be widened to enable the emission angle of laser light to be made narrow in a horizontal direction and enable emission of laser light of higher intensity.

The above-described semiconductor laser device is also provided with the optical path portion, disposed at least at one of either between the light emitting surface and one end of the main waveguide or between the light reflecting surface and the other end of the main waveguide. With this semiconductor laser device, the optical paths of light involved in laser oscillation are limited to optical paths along which light is totally reflected by side surfaces of the main waveguide and reflected substantially perpendicular to (in the predetermined axial direction at) the light emitting surface and the light reflecting surface. However, as mentioned in regard to the object of the present invention, laser light (side peak light) deviating from such restricted optical paths is observed in actuality. With the semiconductor laser device according to the present invention, the optical path portion is arranged so that the side peak light is released from a region, differing from the resonance end face for the laser light, at least at one surface among the light emitting surface and the light reflecting surface. Because the resonance of the side peak light can thus be suppressed in the optical path portion, side peaks in a far-field pattern can be reduced.

The semiconductor laser device array according to the present invention is characterized in having a plurality of semiconductor laser devices of the above-described arrangement and in that the plurality of semiconductor laser devices are disposed and formed integrally in a direction intersecting the predetermined axial direction. With this semiconductor laser device array, by having the plurality of semiconductor laser devices of the above-described arrangement, laser light of high intensity can be emitted and side peaks in a far-field pattern can be reduced.

EFFECTS OF THE INVENTION

With the semiconductor laser device and the semiconductor laser device array according to the present invention, laser light of comparatively high intensity can be emitted and side peaks can be reduced.

BRIEF DESCRIPTION OF THE DRAWINGS

FIG. 2 is a figure including (a) a sectional view of a portion of a section taken on line I-I of the semiconductor laser device array of FIG. 1, and (b) a sectional view of a portion of a section taken on line II-II or line III-III of the semiconductor laser device array of FIG. 1.

FIG. 8 is a figure including (a) a graph of results of observation of a far-field pattern of a prototype of a semiconductor laser device according to the first embodiment, and (b) a graph of results of observation of a far-field pattern of a prototype semiconductor laser device for comparison, which was manufactured using the same substrate but without providing optical path portions between a main waveguide and a light emitting surface and between the main waveguide and a light reflecting surface.

FIG. 9 shows enlarged plan views of the semiconductor laser device array in respective manufacturing steps.

FIG. 23 is a figure including (a) a plan view of an arrangement of a resonator of a conventional laser device, and (b) a diagram of a refractive index distribution in a section taken on line VII-VII or line VIII-VIII of (a).

DESCRIPTION OF THE SYMBOLS

1a—light emitting surface, 1b—light reflecting surface, 1, 1c—semiconductor laser device array, 3, 3a to 3l—semiconductor laser device, 4—main waveguide, 4g, 4h—side surface, 8a, 8b—optical path portion, 8c to 8f—side surface, 9a—ridge portion, 9b to 9e—mound-like portion, 9g, 9h, 9u, 9v—side surface, 10—thin portion, 11—substrate, 12—laminate, 13—n-type clad layer, 14a—laser light emitting end, 14b—laser light reflecting end, 15—active layer, 17—p-type clad layer, 19—p-type cap layer, 21—insulating layer, 21a—opening, 23—p-side electrode layer, 25a to 25c—protruding portion, 29—n-side electrode layer.

BEST MODES FOR CARRYING OUT THE INVENTION

Embodiments of a semiconductor laser device and a semiconductor laser device array according to the present invention shall now be described in detail with reference to the attached drawings. In the description of the drawings, portions that are the same shall be provided with the same symbol and overlapping description shall be omitted.

First Embodiment

Figure 1:
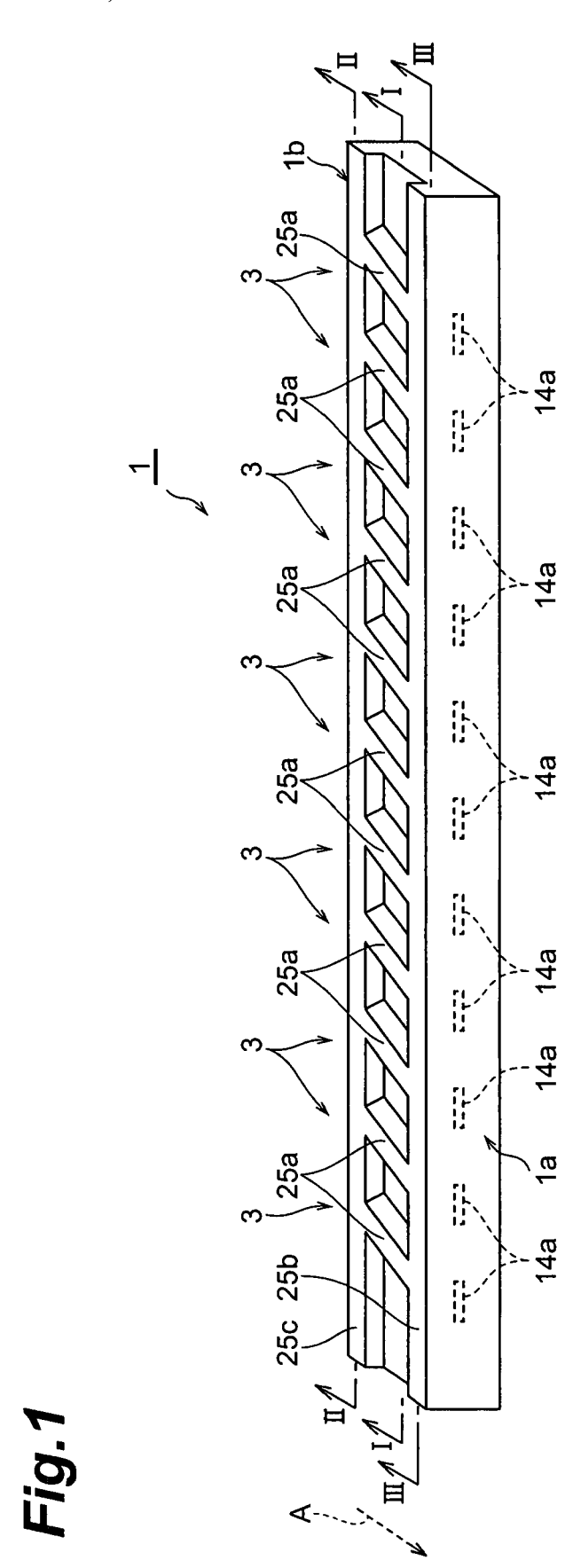
FIG. 1 is a schematic perspective view of an arrangement of a first embodiment of a semiconductor laser device array.

FIG. 1 is a schematic perspective view of an arrangement of a first embodiment of a semiconductor laser device array according to the present invention. As shown in FIG. 1, the semiconductor laser device array 1 is constituted of a plurality of integrally formed semiconductor laser devices 3. Though the number of the semiconductor laser devices 3 that the semiconductor laser device array 1 has may be any number, when there is only one laser device, the arrangement is not an array but a single semiconductor laser device. The semiconductor laser device array 1 has a light emitting surface 1a and a light reflecting surface 1b that are disposed so as to oppose each other in a direction of a predetermined axis A. In the present embodiment, the light emitting surface 1a and the light reflecting surface 1b are disposed substantially parallel to each other, with each intersecting the predetermined axis A substantially perpendicularly. Respective laser light emitting ends 14a of the plurality of semiconductor laser devices 3 are disposed in a horizontal direction on the light emitting surface 1a. Each of the plurality of semiconductor laser devices 3 has a protruding portion 25a that is formed to a ridge-like form. Each protruding portion 25a is formed in a manner such that its longitudinal direction is oblique to the light emitting surface 1a and the light reflecting surface 1b, and in each semiconductor laser device 3, a refractive index type waveguide (to be described later) is formed in correspondence to the protruding portion 25a. The laser light emitting end 14a is a resonance end face for resonance of a laser light in the waveguide and the laser light is emitted from this end face. The plurality of semiconductor laser devices 3 are disposed and formed integrally in a direction that intersects the longitudinal directions of the protruding portions 25a.

The semiconductor laser device array 1 also has protruding portions 25b and 25c. The protruding portions 25b and 25c are formed across the plurality of semiconductor laser devices 3 and respectively along the light emitting surface 1a and the light reflecting surface 1b. One side surface of the protruding portion 25b is the light emitting surface 1a. One side surface of the protruding portion 25c is the light reflecting surface 1b. The protruding portion 25b is joined to the respective light emitting surface 1a side ends of the protruding portions 25a and is formed integral to the respective protruding portions 25a. The protruding portion 25c is joined to the respective light reflecting surface 1b side ends of the protruding portions 25a and is formed integral to the respective protruding portions 25a.

FIG. 2(a) is a sectional view of a portion of a section taken on line I-I of the semiconductor laser device array 1 of FIG. 1. FIG. 2(b) is a sectional view of a portion of a section taken on line II-II or line III-III of the semiconductor laser device array 1 of FIG. 1. Referring now to (a) and (b) in FIG. 2, each of the semiconductor laser devices 3 that constitute the semiconductor laser device array 1 has a substrate 11 and a laminate 12, in which three semiconductor layers are laminated. The laminate 12 is formed by successively laminating the three semiconductor layers of an n-type clad layer (second conductive type clad layer) 13, an active layer 15, and a p-type clad layer (first conductive type clad layer) 17. The p-type clad layer 17 is provided with a ridge portion 9a, corresponding to the protruding portion 25a and mound-like portions 9b and 9c, corresponding to the protruding portions 25b and 25c. A p-type cap layer 19, which is electrically connected to the p-type clad layer 17, is provided at an outer layer of the ridge portion 9a and the mound-like portions 9b and 9c. The protruding portion 25a is formed from the ridge portion 9a and the p-type cap layer 19, and the protruding portions 25b and 25c are formed from the mound-like portions 9b and 9c and the p-type cap layer 19.

A p-side electrode layer 23, by which a current is injected from the exterior, is disposed at a further outer side. An insulating layer 21 is disposed between the p-side electrode layer 23 and the p-type clad layer 17 and p-type cap layer 19. The insulating layer 21 has an opening 21a. A part of the opening 21a is formed as a portion corresponding to a protruding portion 25a. Another part of the opening 21a is formed in a region, in the protruding portion 25b, which reaches the light emitting surface 1a along the direction of the predetermined axis A from one end of the protruding portion 25a. The remaining part of the opening 21a is formed in a region, in the protruding portion 25c, which reaches the light reflecting surface 1b along the direction of the predetermined axis A from the other end of the protruding portion 25a. An n-side electrode layer 29 is formed on a surface of the substrate 11 at the side opposite the laminate 12.

Because the p-side electrode layer 23 electrically contacts only the p-type cap layer 19 via the opening 21a, the injection of current from the exterior is restricted just to a region of the p-type cap layer 19 corresponding to the opening 21a. When a current is injected into the p-type cap layer 19, a region of the active layer 15 corresponding to the opening 21a becomes an active region. In this process, because an effective refractive index difference arises in the active layer 15 due to the refractive index difference between the ridge portion 9a and its periphery, a refractive index type main waveguide 4, corresponding to a planar shape of the ridge portion 9a, is formed inside the active layer 15. Here, because the mound-like portions 9b and 9c are present respectively between the ridge portion 9a and the light emitting surface 1a and between the ridge portion 9a and the light reflecting surface 1b (this shall be described in detail later), one end of the main waveguide 4 and the light emitting surface 1a and the other end of the main waveguide 4 and the light reflecting surface 1b are respectively separated by distances corresponding to the widths of the mound-like portions 9b and 9c. Thus, an optical path portion 8a, for passing through laser light that resonates inside the main waveguide 4, is formed at a portion in the active layer 15 between the one end of the main waveguide 4 and the light emitting surface 1a. Likewise, an optical path portion 8b is formed at a portion in the active layer 15 between the other end of the main waveguide 4 and the light reflecting surface 1b. In the present embodiment, the opening 21a of the insulating layer 21 is formed above the optical path portions 8a and 8b as well. Thus, by the concentrating of current immediately below the opening 21a, gain type waveguides are formed in the optical path portions 8a and 8b.

To give examples of materials of the respective layers constituting the semiconductor laser device 3, the substrate 11 is formed, for example of n-GaAs. The n-type clad layer 13 is formed, for example, of n-AlGaAs. The active layer 15 is constituted, for example, as a multi quantum well formed of GaInAs/AlGaAs. The p-type clad layer 17 is formed, for example, of p-AlGaAs. The p-type cap layer 19 is formed, for example, of p-GaAs. The p-side electrode layer 23 is formed, for example, of Ti/Pt/Au. The n-side electrode layer 29 is formed, for example, of AuGe/Au. The insulating layer 21 is formed, for example, of at least one type of material selected from the group consisting of SiN, $SiO_2$, and $Al_2O_3$.

The semiconductor laser device 3 may have optical guide layers, for confinement of light in the main waveguide 4 and the optical path portions 8a and 8b, between the active layer 15 and the n-type clad layer 13 and between the active layer 15 and the p-type clad layer 17. When the semiconductor laser device 3 has optical guide layers, each optical guide layer may be of the same conductive type as the neighboring clad layer or may be formed without the impurity that determines the conductive type being added.

Figure 3:
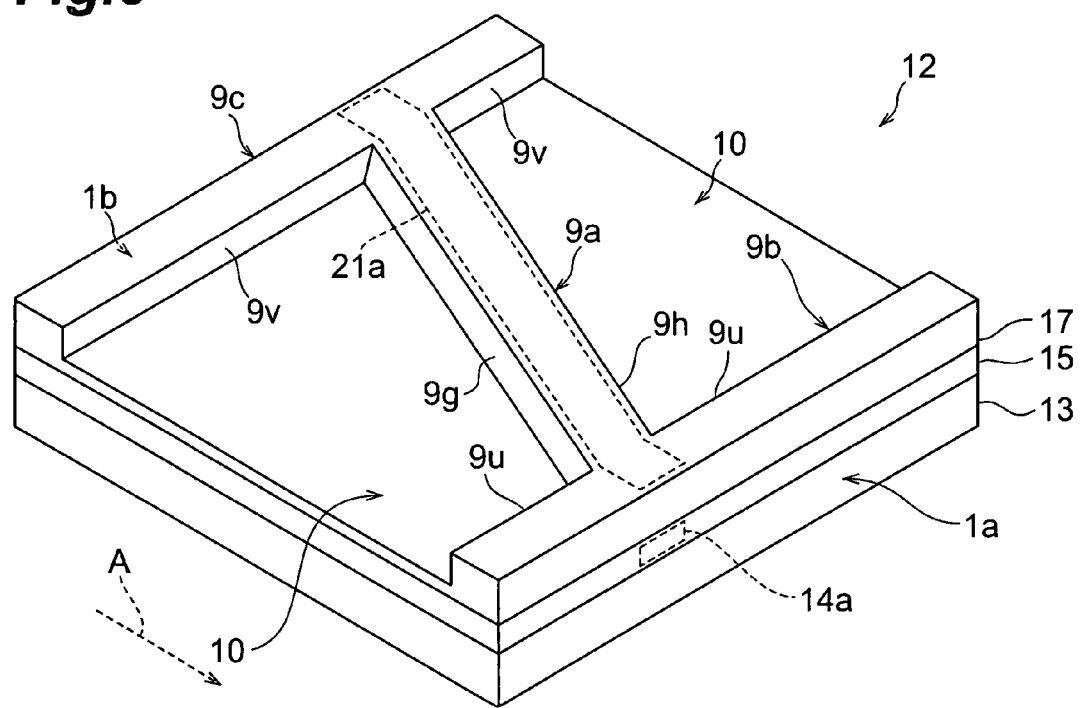
FIG. 3 is a perspective view of a laminate including a p-type clad layer.
Figure 4:
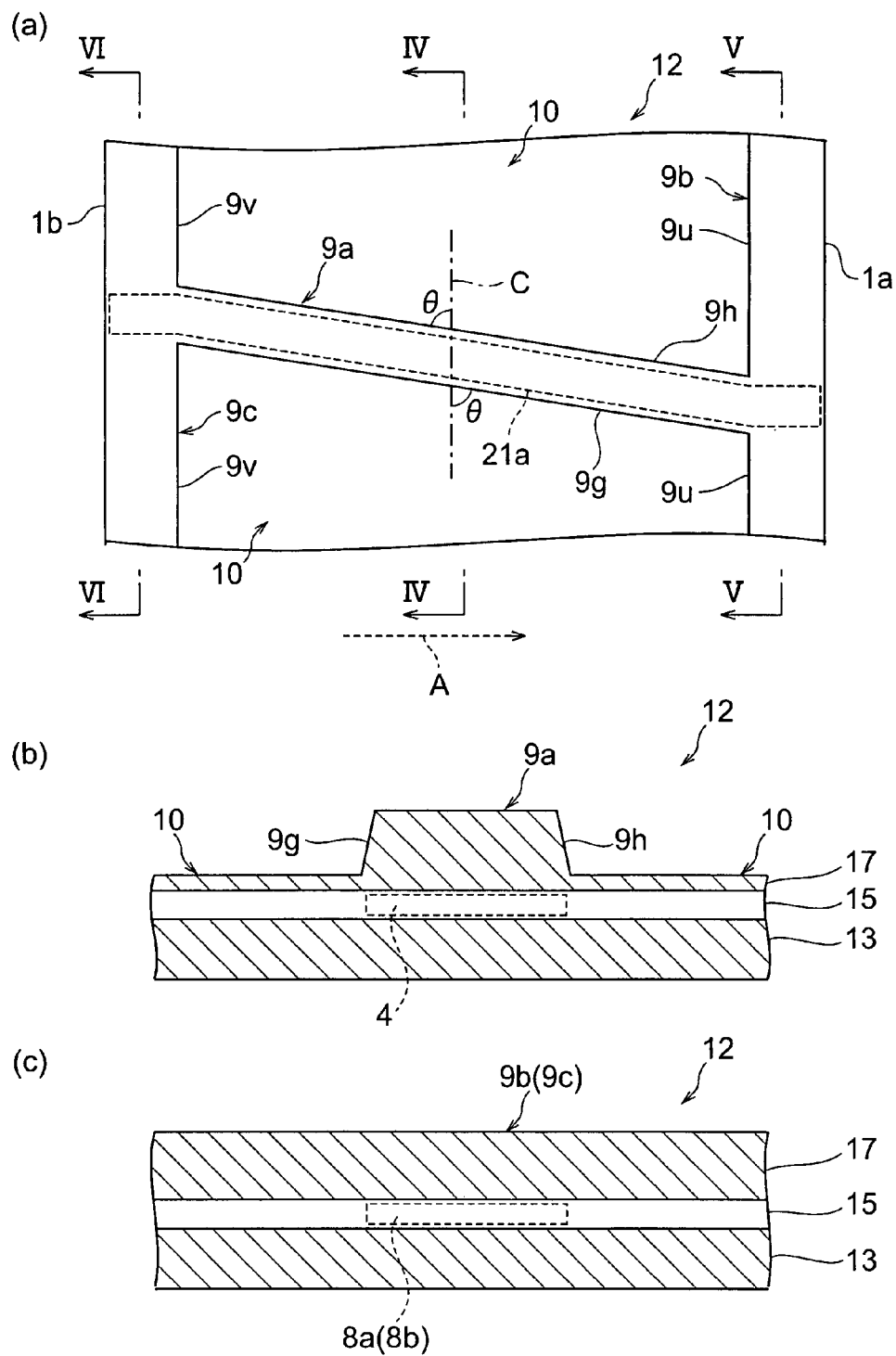
FIG. 4 is a figure including (a) a plan view of the laminate, (b) a sectional view of a section taken on line IV-IV of the laminate of (a), and (c) a sectional view of a section taken on line V-V or line VI-VI of the laminate of (a).

The p-type clad layer 17 shall now be described with reference to FIGS. 3 and 4. FIG. 3 is a perspective view of the laminate 12 that includes the p-type clad layer 17, (a) in FIG. 4 is a plan view of the laminate 12, (b) in FIG. 4 is a sectional view of a section taken on line IV-IV of the laminate 12 of FIG. 4(a), and (c) in FIG. 4 is a sectional view of a section taken on line V-V or line VI-VI of the laminate 12 of FIG. 4(a). As mentioned above, the laminate 12 is formed by successively laminating the three semiconductor layers of the n-type clad layer 13, the active layer 15, and the p-type clad layer 17.

The protruding ridge portion 9a is formed in the p-type clad layer 17. The mound-like portions 9b and 9c, which are thicker than other regions (besides the ridge portion 9a) of the p-type clad layer 17, are also formed in the p-type clad layer 17. The regions of the p-type clad layer 17 besides the ridge portion 9a and the mound-like portions 9b and 9c are thin portions 10, which are thinner than the ridge portion 9a and the mound-like portions 9b and 9c. The ridge portion 9a has a pair of mutually opposing side surfaces 9g and 9h. Each of the pair of side surfaces 9g and 9h defines the region of the ridge portion 9a and is a boundary between the ridge portion 9a and a thin portion 10. In a plan view as viewed in the thickness direction, the side surfaces 9g and 9h are disposed so as to form a relative angle θ with respect to the light emitting surface 1a and the light reflecting surface 1b. The mound-like portion 9b has a side surface 9u. The side surface that opposes the side surface 9u of the mound-like portion 9b is the light emitting surface 1a, and the side surface 9u extends along the light emitting surface 1a. The side surface 9u defines the region of the mound-like portion 9b and is a boundary between the mound-like portion 9b and the thin portions 10. The mound-like portion 9c has a side surface 9v. The side surface that opposes the side surface 9v of the mound-like portion 9c is the light reflecting surface 1b, and the side surface 9v extends along the light reflecting surface 1b. The side surface 9v defines the region of the mound-like portion 9c and is a boundary between the mound-like portion 9c and the thin portions 10. The side surfaces 9g and 9h of the ridge portion 9a are joined at one end to the side surface 9u of the mound-like portion 9b. The side surfaces 9g and 9h of the ridge portion 9a are joined at the other end to the side surface 9v of the mound-like portion 9c.

The opening 21a of the insulating layer 21 is also formed above the ridge portion 9a and above the mound-like portions 9b and 9c. Because the opening 21a is covered by the p-side electrode layer 23, the opening 21a is indicated by dotted lines in FIG. 3 and FIG. 4(a). A portion of the opening 21a extends along a region sandwiched by the side surfaces 9g and 9h of the ridge portion 9a. Another portion of the opening 21a is formed in a region, above the mound-like portion 9b, that extends along the direction of the predetermined axis A from one end of the ridge portion 9a and reaches the light emitting surface 1a. The remaining portion of the opening 21a is formed in a region, above the mound-like portion 9c, that extends along the direction of the predetermined axis A from the other end of the ridge portion 9a and reaches the light reflecting surface 1b.

Figure 5:
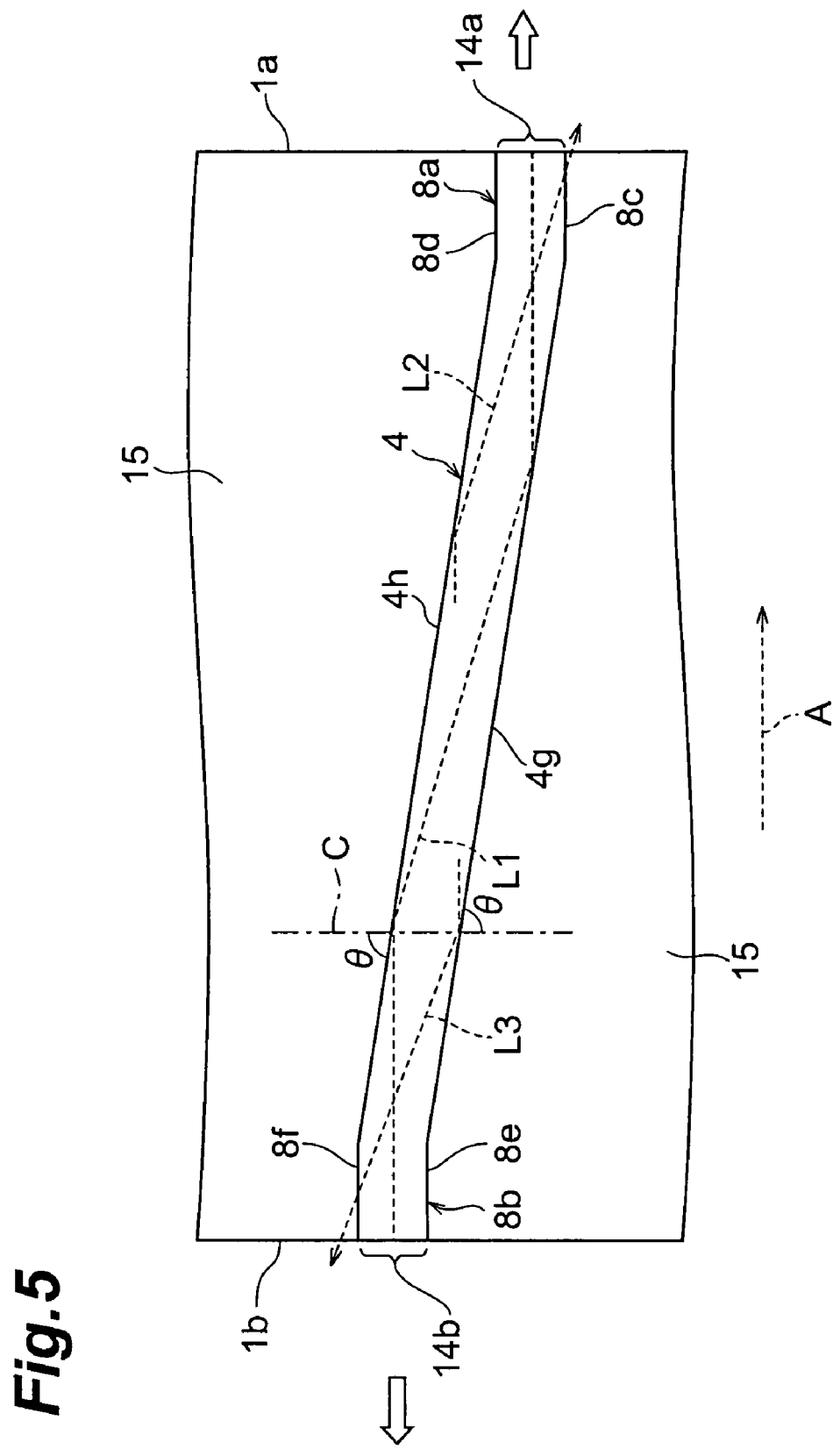
FIG. 5 is a plan view of a main waveguide and optical path portions formed inside an active layer.

The main waveguide 4, corresponding to the planar shape of the ridge portion 9a, is formed in the active layer 15. The optical path portions 8a and 8b, through which the laser light that resonates between the light emitting surface 1a and the light reflecting surface 1b is passed, are formed respectively between the main waveguide 4 and the light emitting surface 1a and between the main waveguide 4 and the light reflecting surface 1b. FIG. 5 is a plan view of the main waveguide 4 and the optical path portions 8a and 8b formed inside the active layer 15. With the main waveguide 4, a pair of side surfaces 4g and 4h are formed in correspondence to the side surfaces 9g and 9h, respectively, of the ridge portion 9a. The side surfaces 4g and 4h form a relative angle θ with respect to the light emitting surface 1a and the light reflecting surface 1b. An auxiliary line C in the figure is parallel to the light emitting surface 1a and the light reflecting surface 1b. A portion of the light emitting surface 1a becomes the laser light emitting end 14a that is one of the resonance end faces for the laser light L1 that resonates in the main waveguide 4. A portion of the light reflecting surface 1b becomes the laser light reflecting end 14b that is the other resonance end face for the laser light L1 that resonates in the main waveguide 4. The laser light emitting end 14a is formed at a position onto which one end of the main waveguide 4 is projected onto the light emitting surface 1a in the direction of the predetermined axis A. The laser light reflecting end 14b is formed at a position onto which the other end of the main waveguide 4 is projected onto the light reflecting surface 1b in the direction of the predetermined axis A.

Also, in the optical path portion 8a, a pair of side surfaces 8c and 8d, which constitute a gain type waveguide, are formed by the concentration of current from the opening 21a (see FIGS. 3 and 4) of the insulating layer 21. The side surfaces 8c and 8d extend along the direction of the predetermined axis A in correspondence to the shape of the opening 21a. The side surface 8c of the optical path portion 8a contacts one end of the laser light emitting end 14a, and the side surface 8d contacts the other end of the laser light emitting end 14a. Furthermore, in the optical path portion 8b, a pair of side surfaces 8e and 8f, which constitute a gain type waveguide, are formed by the concentration of current from the opening 21a of the insulating layer 21. The side surfaces 8e and 8f extend along the direction of the predetermined axis A in correspondence to the shape of the opening 21a. The side surface 8e of the optical path portion 8b contacts one end of the laser light reflecting end 14b, and the side surface 8f contacts the other end of the laser light reflecting end 14b. The side surfaces 4g and 4h of the main waveguide 4 are surfaces formed by the effective refractive index difference between the interior and the exterior of the main waveguide 4, and when the refractive index varies continuously, each side surface may have a certain, fixed thickness. Each of the side surfaces 4g and 4h of the main waveguide 4 functions as a reflecting surface that selectively transmits or reflects the laser light L1 according to the angle of incidence onto the side surface.

One end of the side surface 8c of the optical path portion 8a contacts one end of the laser light emitting end 14a, and one end of the side surface 8d of the optical path portion 8a contacts the other end of the laser light emitting end 14a. The other end of the side surface 8c is joined to one end of the side surface 4g of the main waveguide 4, and the other end of the side surface 8d is joined to one end of the side surface 4h of the main waveguide 4. The other end of the side surface 4g of the main waveguide 4 is joined to one end of the side surface 8e of the optical path portion 8b, and the other end of the side surface 4h is joined to one end of the side surface 8f of the optical path portion 8b. The other end of the side surface 8e of the optical path portion 8b contacts one end of the laser light reflecting end 14b and the other end of the side surface 8f contacts the other end of the laser light reflecting end 14b.

Here, the relative angle θ of the side surfaces 4g and 4h of the main waveguide 4 respectively with respect to the light emitting surface 1a and the light reflecting surface 1b (that is, the relative angle θ of the side surfaces 9g and 9h of the ridge portion 9a respectively with respect to the light emitting surface 1a and the light reflecting surface 1b) is determined based on a total reflection critical angle θc at the side surfaces 4g and 4h of the main waveguide 4. Here, the total reflection critical angle θc of the side surfaces 4g and 4h of the main waveguide 4 is the total reflection critical angle defined by the effective refractive index difference between the interior and the exterior of the main waveguide 4, which is a refractive index type waveguide.

By the relative angle θ being determined based on the total reflection critical angle θc, the pair of side surfaces 4g and 4h of the main waveguide 4 totally reflect the laser light L1 that is made incident along the direction of the predetermined axis A from the light emitting surface 1a side or the light reflecting surface 1b side. In the present embodiment, the total reflection critical angle θc is dependent on the thickness of the thin portion 10 of the p-type clad layer 17. The total reflection critical angle θc at the side surfaces 4g and 4h is thus set to a suitable value by a method, such as adjusting the thickness of the thin portion 10.

As shown in FIG. 5, the laser light L1, which is reflected substantially perpendicularly along the direction of the predetermined axis A at the laser light reflecting end 14b, passes through the optical path portion 8b, is made incident onto the side surface 4h of the main waveguide 4 at the incidence angle θ, and is totally reflected thereby. The laser light L1 is then made incident onto the side surface 4g at the incidence angle θ and is totally reflected thereby. Thereafter, the laser light L1 propagates along the direction of the predetermined axis A, passes through the optical path portion 8a, and reaches the laser light emitting end 14a. A part of the laser light L1 that reaches the laser light emitting end 14a is transmitted through the laser light emitting end 14a and is emitted to the exterior. The other part of the laser light L1 is reflected substantially perpendicularly along the direction of the predetermined axis A at the laser light emitting end 14a, is totally reflected at the side surfaces 4g and 4h again, and returns to the laser light reflecting end 14b. The laser light L1 thus reciprocates and resonates between the laser light emitting end 14a and the laser light reflecting end 14b.

Figure 6:
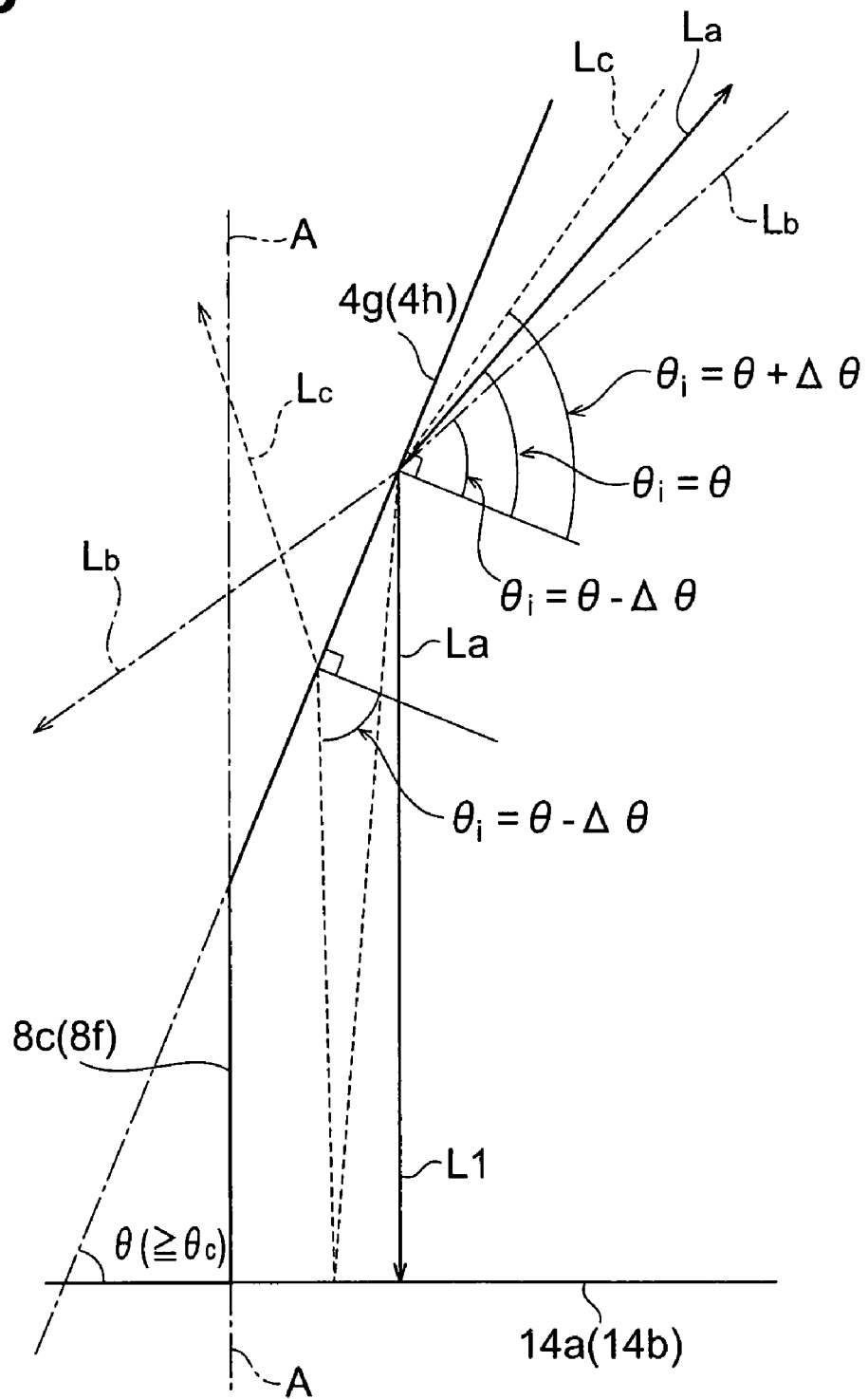
FIG. 6 is a diagram for describing light components made incident at various incidence angles onto a side surface of the main waveguide.

The manner in which the laser light L1 is restricted to the above-described optical path shall now be described. FIG. 6 is a diagram for describing light components La to Lc made incident at various incidence angles θi onto the side surface 4g (4h). Referring to FIG. 6, the laser light La, which is made incident onto the side surface 4g (4h) at an incidence angle θi equal to the relative angle θ ($\geq$θc), is totally reflected at the side surface 4g (4h) and is made incident perpendicularly along the direction of the predetermined axis A onto the laser light emitting end 14a (laser light reflecting end 14b). Then, after being reflected at the laser light emitting end 14a (laser light reflecting end 14b), the laser light La returns along the same optical path. The laser light La thus resonates along the same optical path.

Meanwhile, the laser light Lb, which is made incident on the side surface 4g (4h) at an incidence angle θi=θ−Δθ that is smaller than the relative angle θ, is transmitted through the side surface 4g (4h) and does not resonate if θ−Δθ is less than the total reflection critical angle θc. The laser light Lc, which is made incident on the side surface 4g (4h) at an incidence angle θi=θ−Δθ that is greater than the relative angle θ, is totally reflected at the side surface 4g (4h) because the incidence angle θi is greater than the total reflection critical angle θc, but after reflection at the laser light emitting end 14a (laser light reflecting end 14b), the incidence angle θi of re-incidence onto the side surface 4g (4h) is such that θi=θ−Δθ. If the value of θ−Δθ is less than the total reflection critical angle θc, the laser light Lc is also consequently transmitted through the side surface 4g (4h) and does not resonate. Thus, in the main waveguide 4, when Δθ satisfies θ−Δθ$\geq$θc, only the laser light that is made incident on the side surfaces 4g and 4h at the incidence angle θi (θ+Δθ$\geq$θi$\geq$θ−Δθ) resonates selectively.

Figure 7:
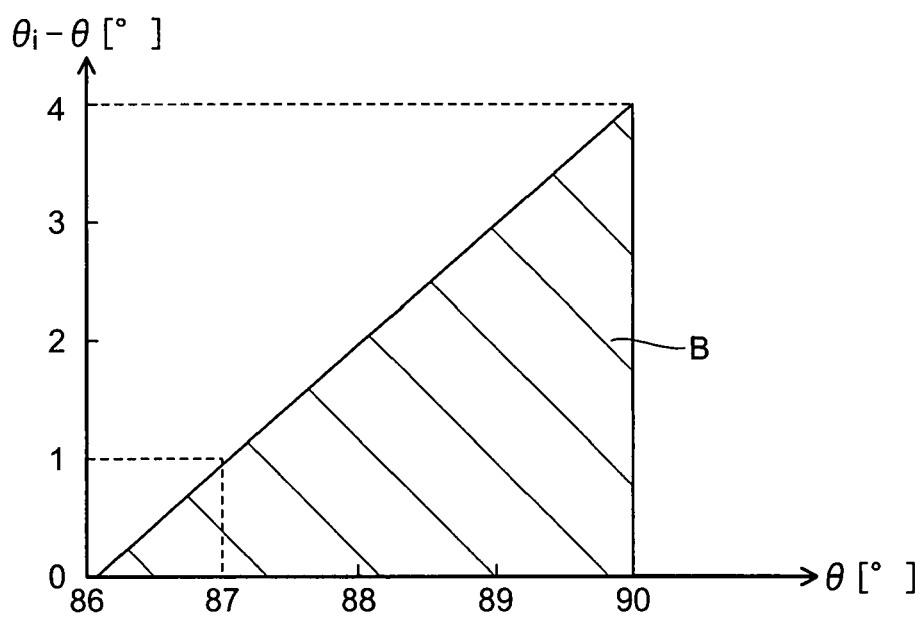
FIG. 7 is a graph for describing an allowable range of the magnitude of a relative angle θ.

If the relative angle θ is substantially matched to the total reflection critical angle θc, the above-mentioned Δθ can be made substantially zero and the angular components of the laser light L1 can be restricted to within an extremely narrow range. However, in actuality, variation of the total reflection critical angle θc with temperature variation of the device, etc., must be considered. If the relative angle θ is close to the total reflection critical angle θc and in a range of being greater than the total reflection critical angle θc, the angular components of the laser light L1 can be restricted to some degree. FIG. 7 is a graph for describing an allowable range of the magnitude of the relative angle θ. In FIG. 7, the abscissa is the magnitude of the relative angle θ, and the ordinate is the difference θi−θ between the incidence angle θi of the laser light L1 onto the side surfaces 4g and 4h and the relative angle θ. Here, a description shall be provided with the assumption that the total reflection critical angle θc at the side surfaces 4g and 4h is 86°.

Referring to FIG. 7, a region B, surrounded by coordinates (θ, θi−θ)=(86, 0), (90, 0), and (90, 4) is shown. This region B indicates a range in which the laser light L1 can resonate between the laser light emitting end 14a and the laser light reflecting end 14b. For example, when the relative angle θ is 89°, the laser light L1 for which 0°$\leq$θi−θ$\leq$3°, that is, for which the incidence angle θi is no less than 86° and no more than 89°, can resonate without exceeding the total reflection critical angle θc (=86°) at the side surfaces 4g and 4h. However, if the relative angle θ is excessively greater than the total reflection critical angle θc, the number of spatial modes of the laser light L1 in the main waveguide 4 increases. Thus, for example, by making the relative angle θ such that 86°$\leq$θ$\leq$87° (that is, θc$\leq$θ$\leq$θc+1°), 0$\leq$θi−θ$\leq$1° can be satisfied, in other words, the incidence angle θi can be restricted to no less than 86° and no more than 87°, and the angular components of the laser light L1 can be restricted to an effective range in terms of practical use.

The angular components of the light involved in laser oscillation inside the main waveguide 4 are thus restricted by the side surfaces 4g and 4h of the main waveguide 4. The waveguided light is thus matched in phase and oscillation of a single-mode or close to a single-mode occurs. Thus, with the semiconductor laser device 3, because the width of the waveguide is not restricted as in a single-mode structure, the waveguide width can be widened to enable the emission angle of laser light L1 to be made narrower in a horizontal direction and enable emission of laser light of higher intensity.

Preferably, the length of the main waveguide 4 and the interval between the side surfaces 4g and 4h (that is, the length of the ridge portion 9a and the interval between the pair of side surfaces 9g and 9h) are set so that the laser light L1, which resonates between the laser light emitting end 14a (light emitting surface 1a) and the laser light reflecting end 14b (light reflecting surface 1b), is reflected by the same number of times at each of the pair of side surfaces 4g and 4h of the main waveguide 4.

FIGS. 3 to 5 shall be referred to again. As mentioned above, the main waveguide 4 is a refractive index type waveguide, and the side surfaces 4g and 4h of the main waveguide 4 are formed by the refractive index difference between the ridge portion 9a of the p-type clad layer 17 and the exterior thereof. Meanwhile, the optical path portions 8a and 8b are gain type waveguides, and the side surfaces 8c to 8f of the optical path portions 8a and 8b are formed only by the concentration of current directly below the opening 21a of the insulating layer 21. The light confinement action at the side surfaces 8c to 8f of the optical path portions 8a and 8b is thus more gradual than the light confinement action at the side surfaces 4g and 4h of the main waveguide 4. That is, light is transmitted more readily at the side surfaces 8c to 8f of the optical path portions 8a and 8b in comparison to the side surfaces 4g and 4h of the main waveguide 4. A light L2, which, among the light passing through the interior of the optical path portion 8a, deviates from the direction of the predetermined axis A, passes through the side surface 8c or 8d of the optical path portion 8a and is emitted to the exterior of the semiconductor laser device 3 from a region that differs from the laser light emitting end 14a at the light emitting surface 1a. Likewise, a light L3, which, among the light passing through the interior of the optical path portion 8b, deviates from the direction of the predetermined axis A, passes through the side surface 8e or 8f of the optical path portion 8b and is emitted to the exterior of the semiconductor laser device 3 from a region that differs from the laser light reflecting end 14b at the light reflecting surface 1b. The light components L2 and L3 that deviate from the direction of the predetermined axis A thus do not contribute to the laser oscillation in the interior of the semiconductor laser device 3. When the optical path portions 8a and 8b are not present, such light components L2 and L3 may resonate inside the waveguide and become side peak light components.

As described above, with the semiconductor laser device 3 of the present embodiment, the optical path portions 8a and 8b are arranged so that light components L2 and L3 deviating from the direction of the predetermined axis A at the optical path portions 8a and 8b are released from a region that differs from the resonance end faces (laser light emitting end 14a and laser light reflecting end 14b) for the laser light L1 at the light emitting surface 1a and the light reflecting surface 1b. Because the resonance of the light components L2 and L3 that constitute side peaks can thus be suppressed at the optical path portions 8a and 8b, side peaks in the far-field pattern can be reduced effectively. Also, by making the optical path portions 8a and 8b gain type waveguides, the lowering of the emission efficiency due to providing the optical path portions 8a and 8b can be suppressed.

FIG. 8(a) is a graph of results of observation of a far-field pattern of a prototype of the semiconductor laser device 3 according to the present embodiment. With this prototype, the length of the main waveguide 4 was set to 1200 μm, the width of the main waveguide 4 was set to 40 μm, the relative angle θ of the side surfaces 4g and 4h of the main waveguide 4 with respect to the light emitting surface 1a and the light reflecting surface 1b, respectively, was set to 86°, and the length of the optical path portions 8a and 8b (that is, the width of the mound-like portions 9b and 9c) was set to 400 μm. FIG. 8(b) is a graph of results of observation of a far-field pattern of a prototype semiconductor laser device for comparison, which was manufactured using the same substrate but without providing optical path portions between the main waveguide and the light emitting surface and between the main waveguide and the light reflecting surface. In (a) and (b) in FIG. 8, the abscissa indicates the radiation angle in the horizontal direction and the ordinate indicates the laser light intensity. In regard to the horizontal radiation angle, a predetermined laser light emission direction (that is, the direction of the predetermined axis A) is set to 0°. As shown in (b) in FIG. 8, when the semiconductor laser device does not have the optical path portions, non-negligible side peaks are present near 10° to 20° with respect to the predetermined laser light emission direction. In contrast, (a) in FIG. 8 shows that the side peaks near 10° to 20° are significantly reduced with the semiconductor laser device 3 of the present embodiment.

Also, as in the present embodiment, it is preferable for an optical path portion (optical path portion 8a) to be provided between the light emitting surface 1a and one end of the main waveguide 4 in the semiconductor laser device 3. The resonance of side peak light components can thereby be suppressed effectively in the vicinity of the light emitting surface 1a even when optical paths of side peak light in the interior of the main waveguide 4 are not clarified accurately. Though in the present embodiment, the optical path portions 8a and 8b are provided both between the light emitting surface 1a and one end of the main waveguide 4 and between the light reflecting surface 1b and the other end of the main waveguide 4, an optical path portion may be provided at one of either between the light emitting surface and one end of the main waveguide or between the light reflecting surface and the other end of the main waveguide.

Also, as described above, with the semiconductor laser device 3 according to the present embodiment, the length and the side surface interval of the main waveguide 4 are preferably set so that the laser light L1, which resonates inside the main waveguide 4 between the light emitting surface 1a and the light reflecting surface 1b, is reflected the same number of times at each of the pair of side surfaces 4g and 4h. The laser light L1 can thereby be made to be incident or reflected substantially perpendicularly along the direction of the predetermined axis A at both the light emitting surface 1a and the light reflecting surface 1b. Also, because the laser light L1 is totally reflected at least once at each of the side surfaces 4g and 4h of the main waveguide 4, there are no optical paths in the main waveguide 4 that join the light emitting surface 1a and the light reflecting surface 1b in a straight line. Thus, with the semiconductor laser device 3 of the present embodiment, the optical paths of the laser light L in the main waveguide 4 can be restricted favorably.

With the semiconductor laser device array 1 according to the present embodiment, by being equipped with the plurality of semiconductor laser devices 3 that provide the above-described effects, laser light of high intensity can be emitted and side peaks in the far-field patterns of the respective semiconductor laser devices 3 can be reduced. The semiconductor laser device array 1 according to the present embodiment furthermore provides the following effects. That is, with the semiconductor laser device array 1, current is made to be injected concentratingly into portions of the active layer 15 by the ridge portions 9a of the p-type clad layer 17. Coupling and interference of light of the main waveguides 4 of adjacent semiconductor laser devices 3 thus do not occur readily. Because the mutual interval between main waveguides 4 can thereby be made comparatively narrow, a larger number of main waveguides 4 can be disposed to enable emission of stable laser light at high output. Furthermore, by current being injected concentratingly into portions of the active layer 15, the electricity/light conversion efficiency is increased, and because the reactive current can be decreased, heat generation by the semiconductor laser devices 3 can be reduced. The semiconductor laser device array 1 can thus be made high in reliability and long in life.

Figure 10:
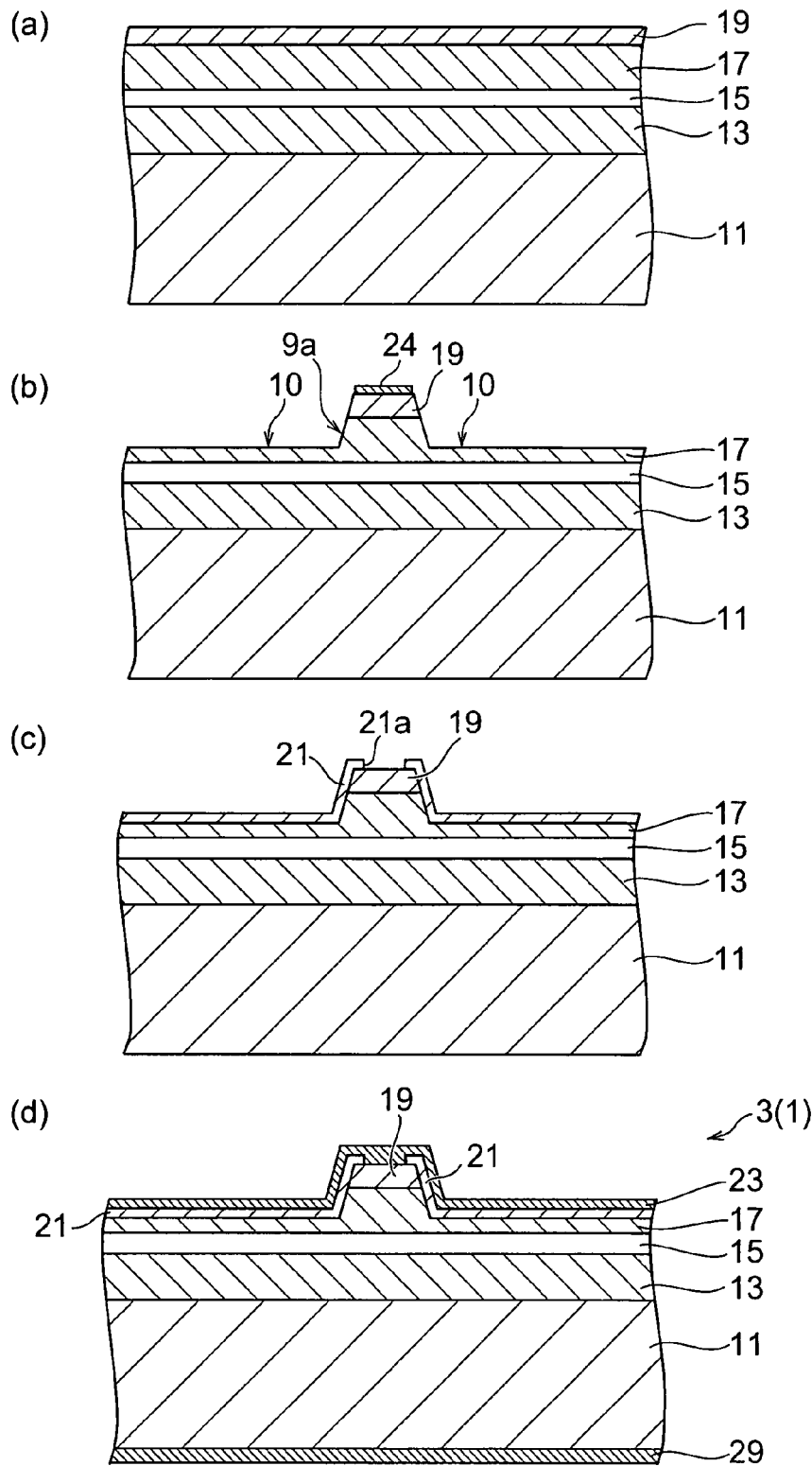
FIG. 10 shows enlarged sectional views of the semiconductor laser device array in the respective manufacturing steps.

A method for manufacturing the semiconductor laser device array 1 shall now be described with reference to FIGS. 9 and 10. FIG. 9 shows enlarged plan views of the semiconductor laser device array 1 in respective manufacturing steps. FIG. 10 shows enlarged sectional views of sections taken on line I-I (see FIG. 1) of the semiconductor laser device array 1 in the respective manufacturing steps. First, an n-type GaAs substrate 11 is prepared, and then 2.0 µm of n-type AlGaAs, 0.3 µm of GaInAs/AlGaAs, 2.0 µm of p-type AlGaAs, and 0.1 µm of p-type GaAs are epitaxially grown successively above the substrate 11, thereby respectively forming the n-type clad layer 13, the active layer 15, having the quantum well structure, the p-type clad layer 17, and the p-type cap layer 19 (see (a) in FIG. 9 and (a) in FIG. 10).

A protective mask 24, corresponding to the shapes of the ridge portions 9a and the mound-like portions 9b and 9c, are then formed by photo-working on the p-type cap layer 19 side, and the p-type cap layer 19 and the p-type clad layer 17 are etched. The etching is stopped at a depth that does not reach the active layer 15 (see (b) in FIG. 9 and (b) in FIG. 10). An SiN film is then deposited on the entire crystal surface to form the insulating layer 21, and portions of the SiN film are removed by photo-working to form the openings 21a (see (c) in FIG. 9 and (c) in FIG. 10). The p-side electrode layer 23 is then formed over the entire crystal surface from a Ti/Pt/Au film. Polishing and chemical treatment of the substrate 11 side surface is then performed and the n-side electrode layer 29 is formed from AuGe/Au (see (d) in FIG. 9 and (d) in FIG. 10). Lastly, the light emitting surface 1a is coated with an AR reflecting film and the light reflecting surface 1B is coated with an HR reflecting film to complete the semiconductor laser devices 3 (semiconductor laser device array 1).

First Modification Example

Figure 11:
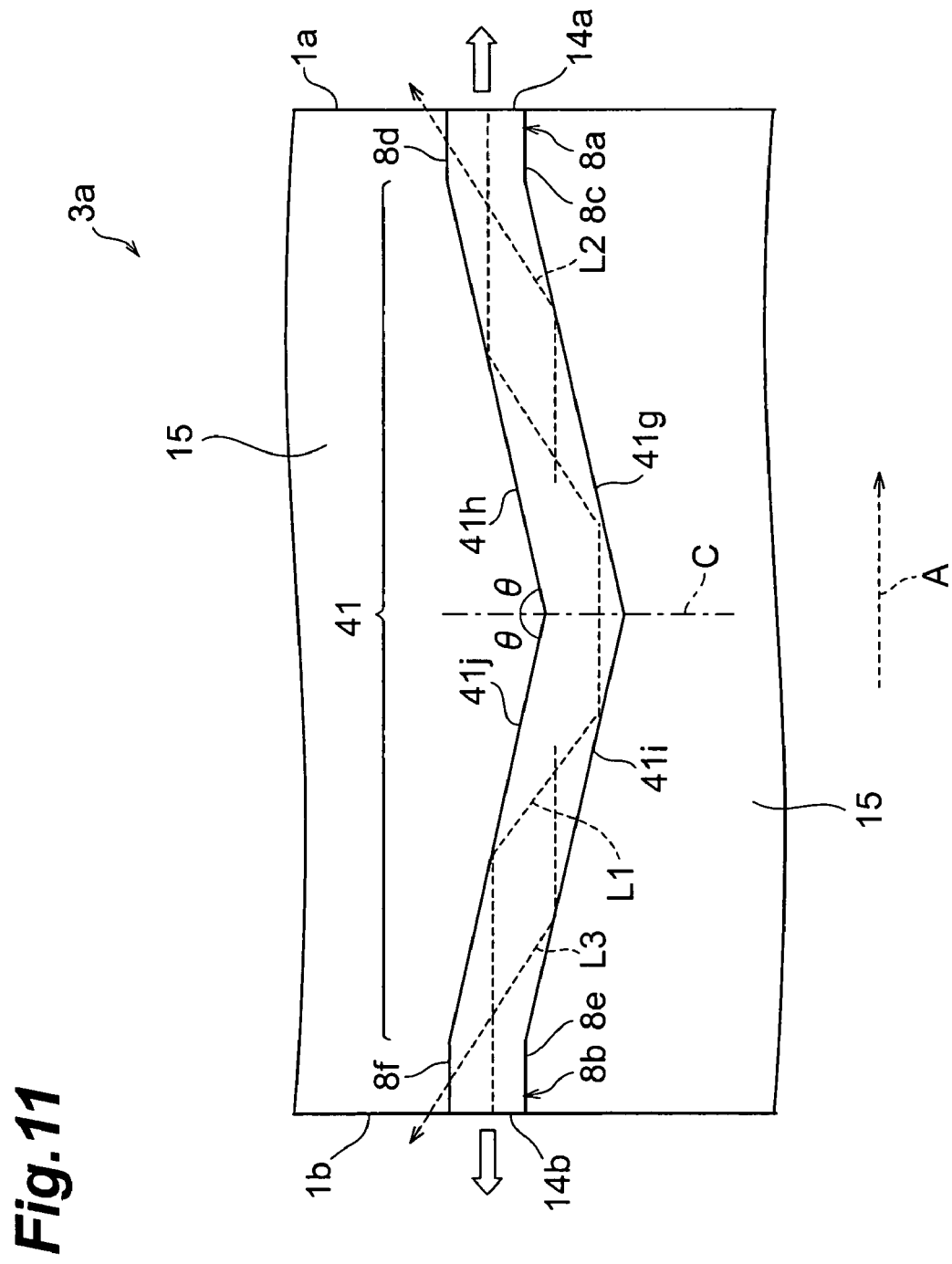
FIG. 11 is a plan view of a main waveguide and optical path portions of a semiconductor laser device according to a first modification example.

A first modification example of the semiconductor laser device array 1 (semiconductor laser device 3) according to the first embodiment shall now be described. FIG. 11 is a plan view of a main waveguide 41 and the optical path portions 8a and 8b of a semiconductor laser device 3a according to the present modification example. The semiconductor laser device 3a according to the present modification example differs from the semiconductor laser device 3 according to the first embodiment in the planar shape of the main waveguide 41.

The main waveguide 41 according to the present modification example has a pair of mutually opposing side surfaces 41g and 41h. The main waveguide 41 also has a pair of mutually opposing side surfaces 41i and 41j. One end of the side surface 41g of the main waveguide 41 is joined to the side surface 8c of the optical path portion 8a, and the other end of the side surface 41g is joined to one end of the side surface 41i. One end of the side surface 41h of the main waveguide 41 is joined to the side surface 8d of the optical path portion 8a, and the other end of the side surface 41h is joined to one end of the side surface 41j. The other end of the side surface 41i is joined to the side surface 8e of the optical path portion 8b. The other end of the side surface 41j is joined to the side surface 8f of the optical path portion 8b. The side surfaces 41g to 41j of the main waveguide 41 form a relative angle $\theta$ with respect to the light emitting surface 1a and the light reflecting surface 1b. The side surfaces 41g and 41h and the side surfaces 41i and 41j are mutually opposite in the direction of inclination with respect to the direction of the predetermined axis A, with the side surface 41g and the side surface 41i being joined mutually to form an angle $2\theta$ and the side surface 41h and the side surface 41j being joined mutually to form the angle $2\theta$. The auxiliary line C in the figure is parallel to the light emitting surface 1a and the light reflecting surface 1b. The shape of such a main waveguide 41 can be realized favorably by forming the planar shape of the ridge portion of the p-type clad layer 17 in the same manner as the planar shape of the main waveguide 41.

The relative angle $\theta$ of the side surfaces 41g to 41j of the main waveguide 41 with respect to the light emitting surface 1a and the light reflecting surface 1b is determined based on the total reflection critical angle $\theta c$ at the side surfaces 41g to 41j of the main waveguide 41. The pair of side surfaces 41g and 41h and the pair of side surfaces 41i and 41j of the main waveguide 41 are thereby made to totally reflect the laser light L1 that is made incident along the direction of the predetermined axis A from the light emitting surface 1a side or the light reflecting surface 1b side. Though in the present embodiment, the relative angle of the side surfaces 41g and 41h with respect to the light emitting surface 1a and the light reflecting surface 1b and the relative angle of the side surfaces 41i and 41j with respect to the light emitting surface 1a and the light reflecting surface 1b are set to the same angle $\theta$, the relative angles may differ from each other. In this case, the total reflection critical angle of the side surfaces 41g and 41h and the total reflection critical angle of the side surfaces 41i and 41j differ from each other. The relative angles of the side surfaces 41g to 41j with respect to the light emitting surface 1a and the light reflecting surface 1b are determined individually based on the total reflection critical angles at the side surfaces 41g to 41j. The total reflection critical angles at the side surfaces 41g to 41j can be set to suitable values by a method, such as adjusting the thickness of the thin portion 10 of the p-type clad layer 17.

The laser light L1, which is reflected substantially perpendicularly along the direction of the predetermined axis A at the laser light reflecting end 14b, passes through the optical path portion 8b and is made incident at the incidence angle $\theta$ onto and is totally reflected by the side surface 41j of the main waveguide 41. The laser light L1 is then made incident at the incidence angle $\theta$ onto and is totally reflected by the side surface 41i. The laser light L1 then propagates along the direction of the predetermined axis A and is made incident at the incidence angle $\theta$ onto and is totally reflected by the side surface 41g. The laser light L1 is then made incident at the incidence angle $\theta$ onto and is totally reflected by the side surface 41h. The laser light L1 that is thus totally reflected at the side surfaces 41g to 41j propagates along the direction of the predetermined axis A, passes through the optical path portion 8a, and reaches the laser light emitting end 14a. A part of the laser light L1 that reaches the laser light emitting end 14a is transmitted through the laser light emitting end 14a and is emitted to the exterior. The other part of the laser light L1 is reflected substantially perpendicularly along the direction of the predetermined axis A at the laser light emitting end 14a, is totally reflected at the side surfaces 41g to 41j again, and returns to the laser light reflecting end 14b. The laser light L1 thus reciprocates and resonates between the laser light emitting end 14a and the laser light reflecting end 14b.

Among the light passing through the interior of the optical path portion 8a, the light L2, which deviates from the direction of the predetermined axis A, passes through the side surface 8c or 8d of the optical path portion 8a and is emitted to the exterior of the semiconductor laser device 3a from a region that differs from the laser light emitting end 14a at the light emitting surface 1a. Likewise, the light L3, which, among the light passing through the interior of the optical path portion 8b, deviates from the direction of the predetermined axis A, passes through the side surface 8e or 8f of the optical path portion 8b and is emitted to the exterior of the semiconductor laser device 3a from a region that differs from the laser light reflecting end 14b at the light reflecting surface 1b. The light components L2 and L3 that deviate from the direction of the predetermined axis A thus do not contribute to the laser oscillation in the interior of the semiconductor laser device 3a. Thus, as with the semiconductor laser device 3 of the first embodiment, the resonance of light that constitutes side peaks can be suppressed in the optical path portions 8a and 8b and side peaks in the far-field pattern can be reduced effectively.

The planar shape of the main waveguide of the semiconductor laser device according to the present invention is not restricted to the shape such as that of the first embodiment and may be the same as that of the present modification example. The same effects as those of the first embodiment can be obtained in this case as well. Also, with the main waveguide 41 of the present modification example, the side surfaces 41g and 41h and the side surfaces 41i and 41j are mutually opposite in the direction of inclination with respect to the direction of the predetermined axis A. By arranging the main waveguide 41 thus, the forming of optical paths besides those of the laser light L1 that resonates within limited optical paths can be prevented more effectively and side peak light can thereby be reduced further.

Second Modification Example

Figure 12:
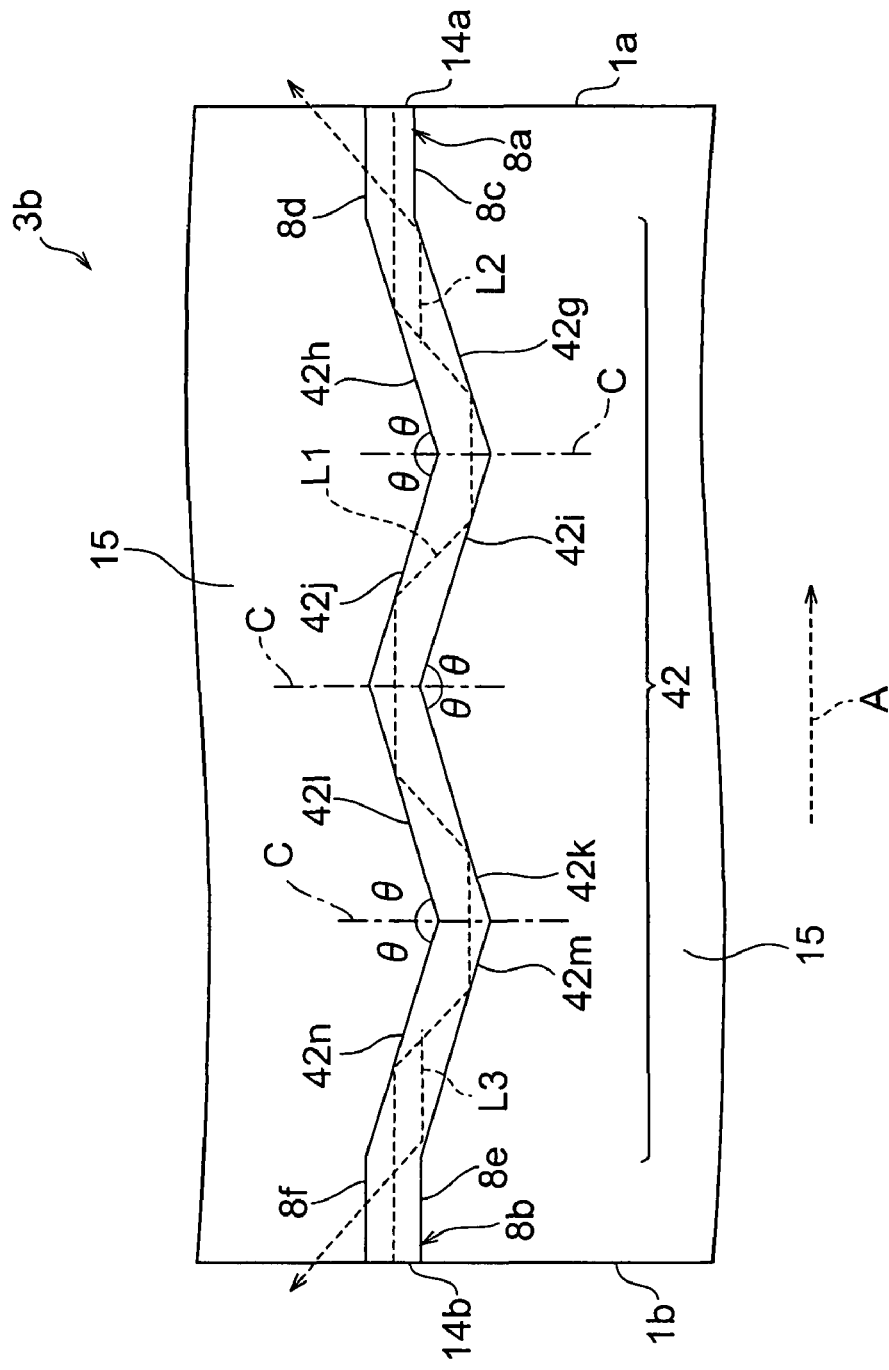
FIG. 12 is a plan view of a main waveguide and optical path portions of a semiconductor laser device according to a second modification example.

A second modification example of the semiconductor laser device array 1 (semiconductor laser device 3) according to the first embodiment shall now be described. FIG. 12 is a plan view of a main waveguide 42 and the optical path portions 8a and 8b of a semiconductor laser device 3b according to the present modification example. The semiconductor laser device 3b according to the present modification example differs from the semiconductor laser device 3 according to the first embodiment in the planar shape of the main waveguide 42.

The main waveguide 42 according to the present modification example has a pair of mutually opposing side surfaces 42g and 42h. The main waveguide 42 also has a pair of mutually opposing side surfaces 42i and 42j. The main waveguide 42 also has a pair of mutually opposing side surfaces 42k and 42l. The main waveguide 42 also has a pair of mutually opposing side surfaces 42m and 42n. One end of the side surface 42g of the main waveguide 42 is joined to the side surface 8c of the optical path portion 8a, and the other end of the side surface 42g is joined to one end of the side surface 42i. One end of the side surface 42h of the main waveguide 42 is joined to the side surface 8d of the optical path portion 8a, and the other end of the side surface 42h is joined to one end of the side surface 42j. The other end of the side surface 42i is joined to one end of the side surface 42k. The other end of the side surface 42j is joined to one end of the side surface 42l. The other end of the side surface 42k is joined to one end of the side surface 42m. The other end of the side surface 42l is joined to one end of the side surface 42n. The other end of the side surface 42m is joined to the side surface 8e of the optical path portion 8b, and the other end of the side surface 42n is joined to the side surface 8f of the optical path portion 8b.

The side surfaces 42g to 42n of the main waveguide 42 form a relative angle $\theta$ with respect to the light emitting surface 1a and the light reflecting surface 1b. The side surfaces 42g and 42h and the side surfaces 42k and 42l are opposite in the direction of inclination from the direction of the predetermined axis A with respect to the side surfaces 42i and 42j and the side surfaces 42m and 42n. The side surface 42g and the side surface 42i are joined mutually to form an angle $2\theta$. The side surface 42h and the side surface 42j are joined mutually to form the angle $2\theta$. The side surface 42i and the side surface 42k are joined mutually to form the angle $2\theta$. The side surface 42j and the side surface 42l are joined mutually to form the angle $2\theta$. The side surface 42k and the side surface 42m are joined mutually to form the angle $2\theta$. The side surface 42l and the side surface 42n are joined mutually to form the angle $2\theta$. The auxiliary line C in the figure is parallel to the light emitting surface 1a and the light reflecting surface 1b. The shape of such a main waveguide 42 can be realized favorably by forming the planar shape of the ridge portion of the p-type clad layer 17 in the same manner as the planar shape of the main waveguide 42.

The relative angle $\theta$ of the side surfaces 42g to 42n of the main waveguide 42 with respect to the light emitting surface 1a and the light reflecting surface 1b is determined based on the total reflection critical angle $\theta c$ at the side surfaces 42g to 42n of the main waveguide 42. The pair of side surfaces 42g and 42h, the pair of side surfaces 42i and 42j, the pair of side surfaces 42k and 42l, and the pair of side surfaces 42m and 42n of the main waveguide 42 are thereby made to totally reflect the laser light L1 that is made incident along the direction of the predetermined axis A from the light emitting surface 1a side or the light reflecting surface 1b side. As in the first modification example described above, the relative angles of the respective side surfaces 42g to 42n of the main waveguide 42 with respect to the light emitting surface 1a and the light reflecting surface 1b may differ from each other.

The laser light L1, which is reflected substantially perpendicularly along the direction of the predetermined axis A at the laser light reflecting end 14b, passes through the optical path portion 8b, and is made incident at the incidence angle $\theta$ onto and is totally reflected by the side surface 42n of the main waveguide 42. The laser light L1 is then made incident at the incidence angle $\theta$ onto and is totally reflected by the side surface 42m. The laser light L1 then propagates along the direction of the predetermined axis A and is made incident at the incidence angle $\theta$ onto and is totally reflected by the side surface 42k. The laser light L1 is then made incident at the incidence angle $\theta$ onto and is totally reflected by the side surface 42l. The laser light L1 then propagates along the direction of the predetermined axis A and is made incident at the incidence angle $\theta$ onto and is totally reflected by the side surface 42j. The laser light L1 is then made incident at the incidence angle θ onto and is totally reflected by the side surface 42i. The laser light L1 then propagates along the direction of the predetermined axis A and is made incident at the incidence angle θ onto and is totally reflected by the side surface 42g. The laser light L1 is then made incident at the incidence angle θ onto and is totally reflected by the side surface 42h. The laser light L1 that is thus totally reflected at the side surfaces 42g to 42n propagates along the direction of the predetermined axis A, passes through the optical path portion 8a, and reaches the laser light emitting end 14a. A part of the laser light L1 that reaches the laser light emitting end 14a is transmitted through the laser light emitting end 14a and is emitted to the exterior. The other part of the laser light L1 is reflected substantially perpendicularly along the direction of the predetermined axis A at the laser light emitting end 14a, is totally reflected at the side surfaces 42g to 42n again, and returns to the laser light reflecting end 14b. The laser light L1 thus reciprocates and resonates between the laser light emitting end 14a and the laser light reflecting end 14b.

Among the light passing through the interior of the optical path portion 8a, the light L2, which deviates from the direction of the predetermined axis A, passes through the side surface 8c or 8d of the optical path portion 8a and is emitted to the exterior of the semiconductor laser device 3b from a region that differs from the laser light emitting end 14a at the light emitting surface 1a. Likewise, the light L3, which, among the light passing through the interior of the optical path portion 8b, deviates from the direction of the predetermined axis A, passes through the side surface 8e or 8f of the optical path portion 8b and is emitted to the exterior of the semiconductor laser device 3b from a region that differs from the laser light reflecting end 14b at the light reflecting surface 1b. The light components L2 and L3 that deviate from the direction of the predetermined axis A thus do not contribute to the laser oscillation in the interior of the semiconductor laser device 3b. Thus, as with the semiconductor laser device 3 of the first embodiment, the resonance of light that constitutes side peaks can be suppressed in the optical path portions 8a and 8b and side peaks in the far-field pattern can be reduced effectively.

The planar shape of the main waveguide of the semiconductor laser device according to the present invention is not restricted to the shape such as that of the first embodiment and may be the same as that of the present modification example. The same effects as those of the first embodiment can be obtained in this case as well. Also, with the main waveguide 42 of the present modification example, the side surfaces 42g and 42h and the side surfaces 42k and 42l are opposite in the direction of inclination from the direction of the predetermined axis A with respect to the side surfaces 42i and 42j and the side surfaces 42m and 42n. Side peak light can thereby be reduced further.

Third Modification Example

Figure 13:
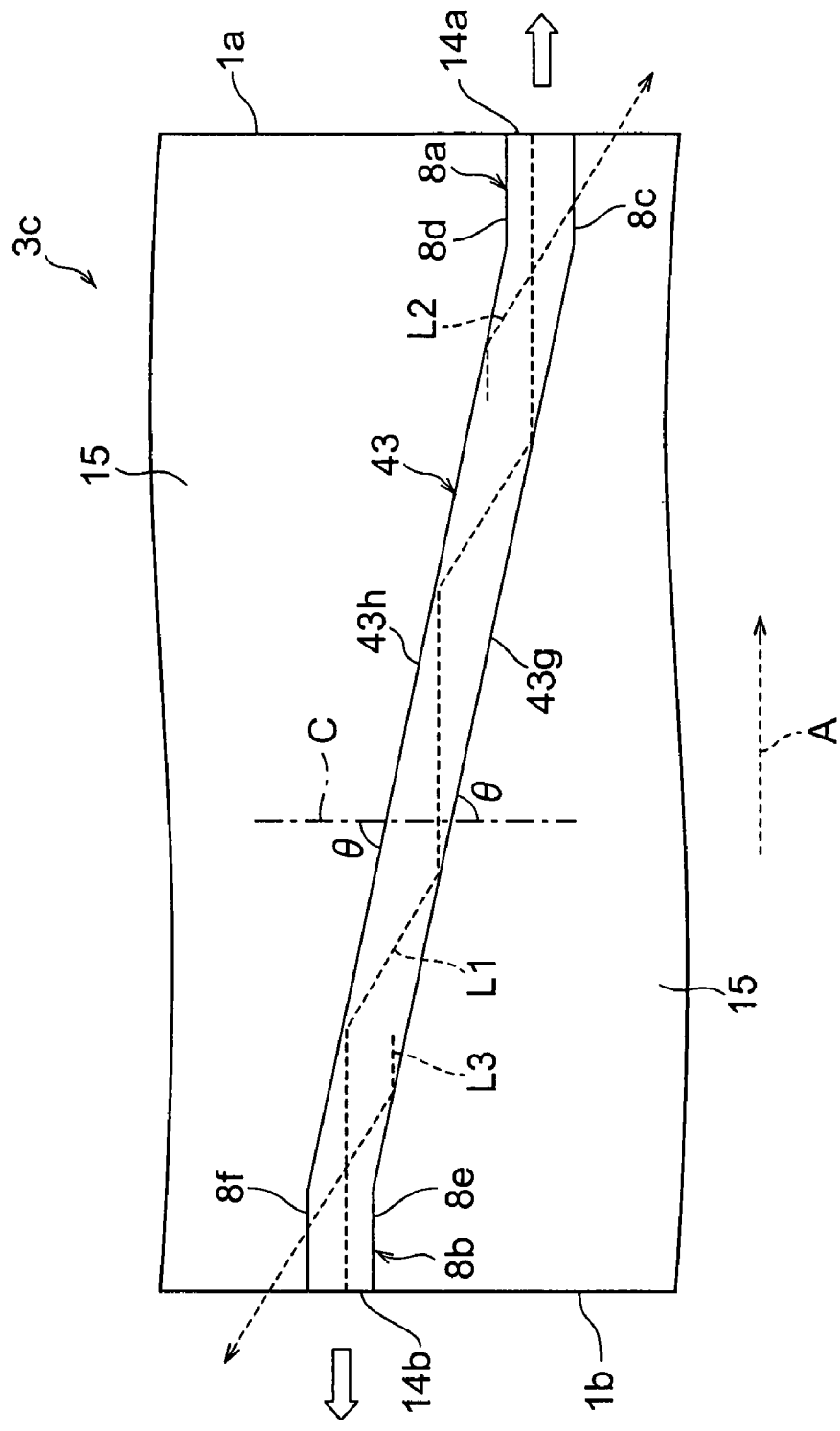
FIG. 13 is a plan view of a main waveguide and optical path portions of a semiconductor laser device according to a third modification example.

A third modification example of the semiconductor laser device array 1 (semiconductor laser device 3) according to the first embodiment shall now be described. FIG. 13 is a plan view of a main waveguide 43 and the optical path portions 8a and 8b of a semiconductor laser device 3c according to the present modification example. The semiconductor laser device 3c according to the present modification example differs from the semiconductor laser device 3 according to the first embodiment in the planar shape of the main waveguide 43.

The main waveguide 43 according to the present modification example has a pair of mutually opposing side surfaces 43g and 43h. One end of the side surface 43g of the main waveguide 43 is joined to the side surface 8c of the optical path portion 8a, and the other end of the side surface 43g is joined to the side surface 8e of the optical path portion 8b. One end of the side surface 43h of the main waveguide 43 is joined to the side surface 8d of the optical path portion 8a, and the other end of the side surface 43h is joined to the side surface 8f of the optical path portion 8b. The side surfaces 43g and 43h of the main waveguide 43 form a relative angle θ with respect to the light emitting surface 1a and the light reflecting surface 1b. The auxiliary line C in the figure is parallel to the light emitting surface 1a and the light reflecting surface 1b. The shape of such a main waveguide 43 can be realized favorably by forming the planar shape of the ridge portion of the p-type clad layer 17 in the same manner as the planar shape of the main waveguide 43.

The relative angle θ of the side surfaces 43g and 43h of the main waveguide 43 with respect to the light emitting surface 1a and the light reflecting surface 1b is determined based on the total reflection critical angle θc at the side surfaces 43g and 43h of the main waveguide 43. The pair of side surfaces 43g and 43h of the main waveguide 43 are thereby made to totally reflect the laser light L1 that is made incident along the direction of the predetermined axis A from the light emitting surface 1a side or the light reflecting surface 1b side. The length of the main waveguide 43 and the interval between the side surface 43g and the side surface 43h are set so that the laser light L1, which resonates between the light emitting surface 1a and the light reflecting surface 1b in the main waveguide 43, is reflected two times at each of the pair of side surfaces 43g and 43h of the main waveguide 43.

The laser light L1, which is reflected substantially perpendicularly along the direction of the predetermined axis A at the laser light reflecting end 14b, passes through the optical path portion 8b, and is made incident at the incidence angle θ onto and is totally reflected by the side surface 43h of the main waveguide 43. The laser light L1 is then made incident at the incidence angle θ onto and is totally reflected by the side surface 43g. The laser light L1 then propagates along the direction of the predetermined axis A and is made incident again at the incidence angle θ onto and is totally reflected by the side surface 43h. The laser light L1 is then made incident again at the incidence angle θ onto and is totally reflected by the side surface 43g. The laser light L1 that is thus totally reflected at the side surfaces 43g and 43h propagates along the direction of the predetermined axis A, passes through the optical path portion 8a, and reaches the laser light emitting end 14a. A part of the laser light L1 that reaches the laser light emitting end 14a is transmitted through the laser light emitting end 14a and is emitted to the exterior. The other part of the laser light L1 is reflected substantially perpendicularly along the direction of the predetermined axis A at the laser light emitting end 14a, is totally reflected twice at each of the side surfaces 43g and 43h again, and returns to the laser light reflecting end 14b. The laser light L1 thus reciprocates and resonates between the laser light emitting end 14a and the laser light reflecting end 14b.

Among the light passing through the interior of the optical path portion 8a, the light L2, which deviates from the direction of the predetermined axis A, passes through the side surface 8c or 8d of the optical path portion 8a and is emitted to the exterior of the semiconductor laser device 3c from a region that differs from the laser light emitting end 14a at the light emitting surface 1a. Likewise, the light L3, which, among the light passing through the interior of the optical path portion 8b, deviates from the direction of the predetermined axis A, passes through the side surface 8e or 8f of the optical path portion 8b and is emitted to the exterior of the semiconductor laser device 3c from a region that differs from the laser light reflecting end 14b at the light reflecting surface 1b. The light components L2 and L3 that deviate from the direction of the predetermined axis A thus do not contribute to the laser oscillation in the interior of the semiconductor laser device 3c. Thus, as with the semiconductor laser device 3 of the first embodiment, the resonance of light that constitutes side peaks can be suppressed in the optical path portions 8a and 8b and side peaks in the far-field pattern can be reduced effectively.

The planar shape of the main waveguide of the semiconductor laser device according to the present invention is not restricted to the shape such as that of the first embodiment and may be the same as that of the present modification example. The same effects as those of the first embodiment can be obtained in this case as well. Also, with the main waveguide 43 of the present modification example, because the number of times of reflection of the laser light L1 at the side surface 43g and 43h is greater than that of the main waveguide 4 of the first embodiment, the optical paths of the laser light L1 can be restricted more rigidly.

Fourth Modification Example

Figure 14:
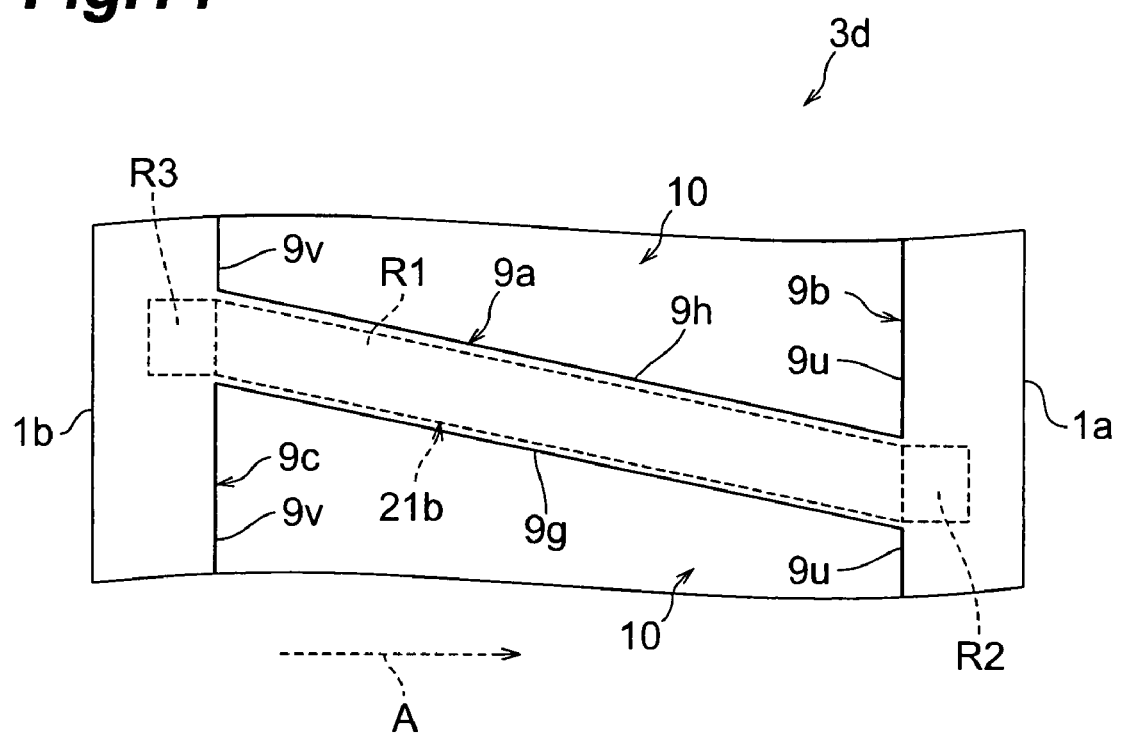
FIG. 14 is a plan view of a ridge portion, mound-like portions, and an opening of an insulating layer of a semiconductor laser device according to a fourth modification example.

A fourth modification example of the semiconductor laser device array 1 (semiconductor laser device 3) according to the first embodiment shall now be described. FIG. 14 is a plan view of the ridge portion 9a, the mound-like portions 9b and 9c, and an opening 21b of the insulating layer 21 of a semiconductor laser device 3d according to the present modification example. The semiconductor laser device 3d according to the present modification example differs from the semiconductor laser device 3 according to the first embodiment in the shape of the opening 21b of the insulating layer 21.

A portion of the opening 21b of the present modification example is formed on a region R1 above the ridge portion 9a. Another portion of the opening 21b is formed on a region R2 that, on the mound-like portion 9b, extends along the direction of the predetermined axis A from one end of the ridge portion 9a and is separated from the light emitting surface 1a by just a predetermined distance (for example, half the width of the mound-like portion 9b). The remaining portion of the opening 21b is formed on a region R3 that, on the mound-like portion 9c, extends along the direction of the predetermined axis A from the other end of the ridge portion 9a and is separated from the light reflecting surface 1b by just a predetermined distance (for example, half the width of the mound-like portion 9c).

With the semiconductor laser device 3d, the injection of current from the exterior is restricted just to a region of the p-type cap layer 19 (see FIG. 2) corresponding to the opening 21b. With the semiconductor laser device 3d of the present modification example, because the opening 21b has the above-described arrangement, the injection of current into the p-type cap layer 19 occurs in the region R1, above the ridge portion 9a, the region R2, extending along the direction of the predetermined axis A from one end of the ridge portion 9a and being separated from the light emitting surface 1a by the predetermined distance, and the region R3, extending along the direction of the predetermined axis A from the other end of the ridge portion 9a and being separated from the light reflecting surface 1b by the predetermined distance. Thus, only portions (portions corresponding to the regions R2 and R3) of the optical path portions of the present modification example become gain type waveguides. Thus, portions besides the portions of the optical path portions that correspond to the regions R2 and R3 do not constitute a so-called waveguide because current is practically not injected therein.

With the semiconductor laser device according to the present invention, the entireties of the optical path portions 8a and 8b may be gain type waveguides as in the first embodiment, or just portions of the optical path portions may be gain type waveguides as in the present modification example. The semiconductor laser device may also be of an arrangement in which waveguides are not formed in the optical path portions (that is, an arrangement in which a current injection region is formed due to the opening of the insulating layer only above the ridge portion 9a). The proportion of the optical path portions occupied by the gain type waveguides may be determined according to the release efficiency of side peak light and the emission efficiency required of the semiconductor laser device.

Fifth Modification Example

Figure 15:
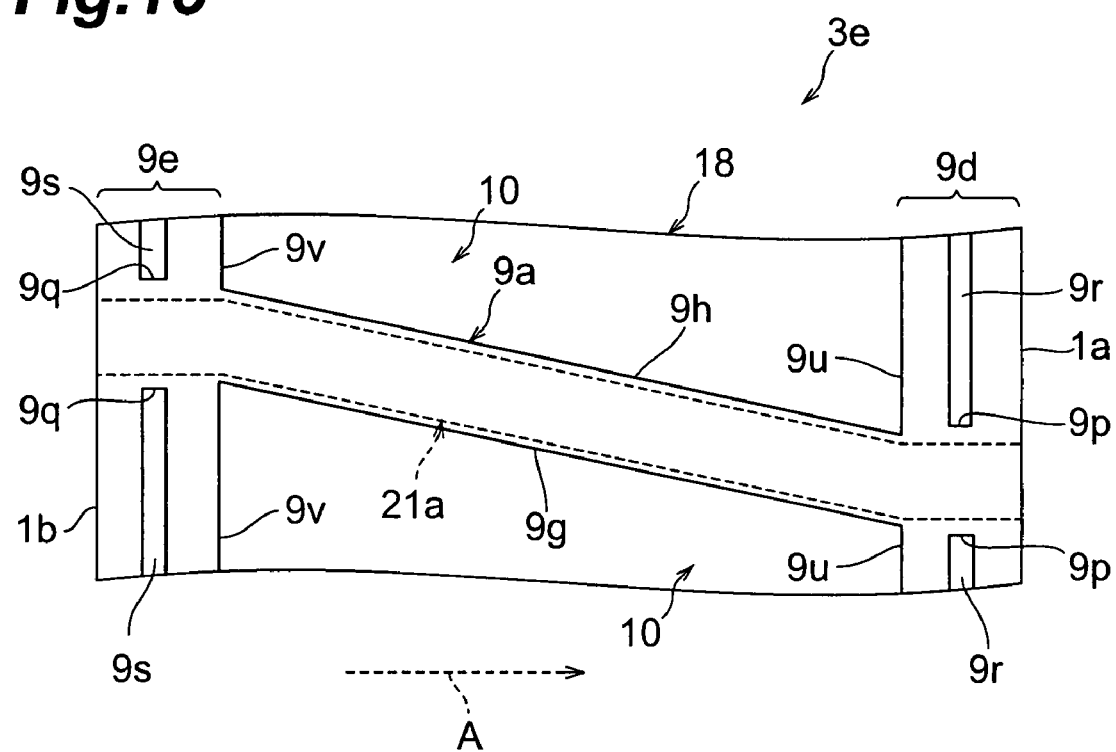
FIG. 15 is a plan view of a ridge portion and mound-like portions of a semiconductor laser device according to a fifth modification example.

A fifth modification example of the semiconductor laser device array 1 (semiconductor laser device 3) according to the first embodiment shall now be described. FIG. 15 is a plan view of the ridge portion 9a and mound-like portions 9d and 9e of a semiconductor laser device 3e according to the present modification example. The semiconductor laser device 3e according to the present modification example differs from the semiconductor laser device 3 according to the first embodiment in the shapes of the mound-like portions 9d and 9e.

The protruding ridge portion 9a and the mound-like portions 9d and 9e are formed on the p-type clad layer 18 of the present modification example. The arrangement of the ridge portion 9a is the same as that of the first embodiment. The mound-like portion 9d has side surfaces 9u and 9p. The side surface that opposes the side surface 9u of the mound-like portion 9d is the light emitting surface 1a, and the side surface 9u extends along the light emitting surface 1a. The side surface 9u defines the region of the mound-like portion 9d and is a boundary between the mound-like portion 9d and the thin portions 10. The mound-like portion 9d has grooves 9r, formed intermittently along the light emitting surface 1a, and the side surfaces 9p are end faces of the grooves 9r. The respective side surfaces 9p of adjacent grooves 9r are formed so as to oppose each other across a current injection region in the mound-like portion 9d (that is, a region in which the opening 21a of the insulating layer 21 is formed).

The mound-like portion 9e has side surfaces 9v and 9q. The side surface that opposes the side surface 9v of the mound-like portion 9e is the light reflecting surface 1b and the side surface 9v extends along the light reflecting surface 1b. The side surface 9v defines the region of the mound-like portion 9e and is a boundary between the mound-like portion 9e and the thin portions 10. The mound-like portion 9e has grooves 9s, formed intermittently along the light reflecting surface 1b, and the side surfaces 9q are end faces of the grooves 9s. The respective side surfaces 9q of adjacent grooves 9s are formed so as to oppose each other across a current injection region in the mound-like portion 9e (that is, a region in which the opening 21a of the insulating layer 21 is formed).

Refractive index type waveguides are formed by the side surfaces 9p of the mound-like portion 9d and the side surfaces 9q of the mound-like portion 9e at portions of the optical path portions of the present modification example. The semiconductor laser device according to the present invention may have such an arrangement, and because the other portions of the optical path portions are gain type waveguides, light deviating from the direction of the predetermined axis A can be emitted favorably and resonance of side peak light can be suppressed.

Second Embodiment

Figure 16:
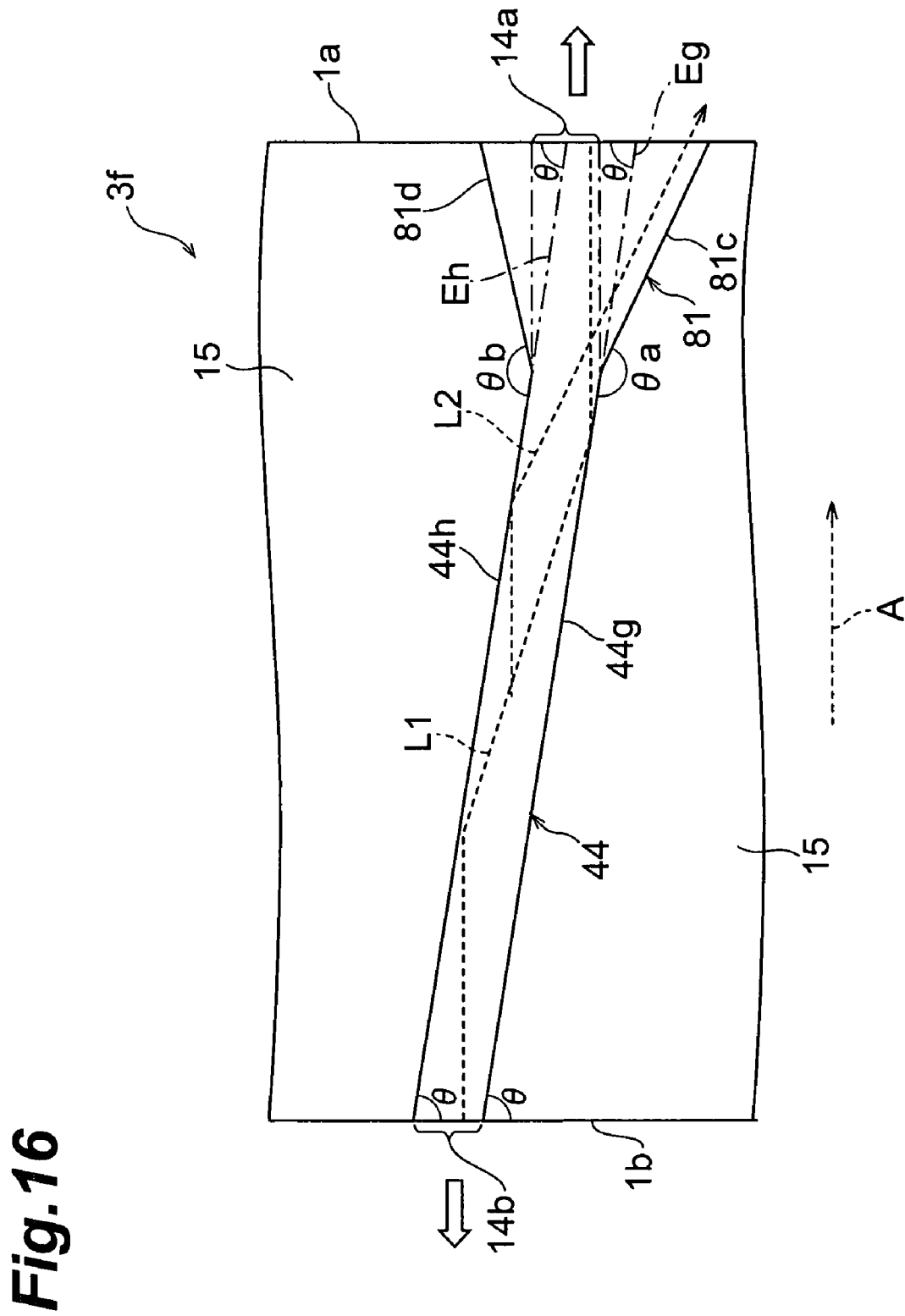
FIG. 16 is a plan view of a waveguide arrangement of a semiconductor laser device of a semiconductor laser device array according to a second embodiment.

A second embodiment of a semiconductor laser device and a semiconductor laser device array according to the present invention shall now be described. FIG. 16 is a plan view of a waveguide arrangement of the semiconductor laser device 3f provided in the semiconductor laser device array according to the present embodiment. The semiconductor laser device 3f of the present embodiment is realized favorably, for example, by a ridge type device arrangement of the same type as the semiconductor laser device 3 of the first embodiment (see, for example, (a) in FIG. 2).

Referring to FIG. 16, the semiconductor laser device 3f of the present embodiment has a main waveguide 44 and an optical path portion 81. The main waveguide 44 is a refractive index type waveguide that is formed inside an active layer by a ridge portion provided in a p-type clad layer. The main waveguide 44 has a pair of side surfaces 44g and 44h. The side surfaces 44g and 44h form a relative angle θ with respect to the light emitting surface 1a and the light reflecting surface 1b. One end of each of the side surfaces 44g and 44h reaches the light reflecting surface 1b. A region sandwiched by the side surfaces 44g and 44h at the light reflecting surface 1b becomes the laser light reflecting end 14b, which is one of the resonance end faces for the laser light L1. With the present embodiment, the laser light emitting end 14a that is the other resonance end face at the light emitting surface 1a is formed at a region onto which the end of the main waveguide 44 at the light emitting surface 1a side is projected onto the light emitting surface 1a.

Also, with the present embodiment, the side surface 44g of the main waveguide 44 is inclined with respect to the predetermined axis A so that an extension line Eg, from the side surface 44g to the light emitting surface 1a, and the light emitting surface 1a form an acute angle at an inner side of the main waveguide 44. Also, the side surface 44h of the main waveguide 44 is inclined with respect to the predetermined axis A so that an extension line Eh, from the side surface 44h to the light emitting surface 1a, and the light emitting surface 1a form an acute angle at an outer side of the main waveguide 44.

The optical path portion 81 is a refractive index type waveguide that is formed in the interior of the active layer by the ridge portion formed in the p-type clad layer. The optical path portion 81 is disposed between the light emitting surface 1a and one end of the main waveguide 44 at the side opposite the light reflecting surface 1b and has a pair of side surfaces 81c and 81d. One end of the side surface 81c is joined to the other end of the side surface 44g of the main waveguide 44 and the other end of the side surface 81c extends to the light emitting surface 1a. The side surface 44g of the main waveguide 44 and the side surface 81c of the optical path portion 81 form an angle θa (<180°−θ) at the outer side of the main waveguide 44 and the optical path portion 81. Put in another way, the side surface 81c of the optical path portion 81 forms a relative angle with respect to a normal to the light emitting surface 1a that is greater than a angle 2(90°−θ) and enlarges the optical path portion 81 toward the direction of emission of the laser light L1. Also, one end of the side surface 81d is joined to the other end of the side surface 44h of the main waveguide 44 and the other end of the side surface 81d extends to the light emitting surface 1a. The side surface 44h of the main waveguide 44 and the side surface 81d of the optical path portion 81 form an angle θb (<180°−θ) at the outer side of the main waveguide 44 and the optical path portion 81. Put in another way, the side surface 81d of the optical path portion 81 is inclined, with respect to a normal to the light emitting surface 1a, in a direction of enlarging the optical path portion 81 toward the light emitting surface 1a.

Actions of the semiconductor laser device 3f according to the present embodiment are as follows. The laser light L1, which is reflected substantially perpendicularly along the direction of the predetermined axis A at the laser light reflecting end 14b is made incident onto the side surface 44h of the main waveguide 4 at the incidence angle θ and is totally reflected thereby. The laser light L1 is then made incident on the side surface 44g at the incidence angle θ and is totally reflected thereby. Thereafter, the laser light L1 propagates along the direction of the predetermined axis A, passes through the optical path portion 81, and reaches the laser light emitting end 14a. A part of the laser light L1 that reaches the laser light emitting end 14a is transmitted through the laser light emitting end 14a and is emitted to the exterior. The other part of the laser light L1 is reflected substantially perpendicularly along the direction of the predetermined axis A at the laser light emitting end 14a, is totally reflected at the side surfaces 44g and 44h again, and returns to the laser light reflecting end 14b. The laser light L1 thus reciprocates and resonates between the laser light emitting end 14a and the laser light reflecting end 14b.

Because the side surface 81c of the optical path portion 81 forms the angle θa (<180°−θ) with the side surface 44g of the main waveguide 44, the light L2, which, among the light that passes through the interior of the optical path portion 81, deviates from the direction of the predetermined axis A, is not made incident on the side surface 81c of the optical path portion 81 and reaches a region of the light emitting surface 1a that differs from the laser light emitting end 14a. A large part of the light L2 passes through the light emitting surface 1a and is emitted to the exterior of the semiconductor laser device 3f and does not contribute to laser oscillation in the interior of the semiconductor laser device 3f. The light L2 that is reflected at the light emitting surface 1a is made incident at a high incidence angle onto the side surface 81c of the optical path portion 81 and is transmitted through the side surface 81c and thus does not contribute to the laser oscillation inside the semiconductor laser device 3f.

Thus with the semiconductor laser device 3f of the present embodiment, the side surface 81c of the optical path portion 81 is arranged so that the light L2 that deviates from the direction of the predetermined axis A in the optical path portion 81 is released from a region of the light emitting surface 1a that differs from the resonance end face (laser light emitting end 14a) for the laser light L1. Because the resonance of the light L2 that constitutes a side peak can thus be suppressed at the optical path portion 81, side peaks in the far-field pattern can be reduced effectively. Also, by making the optical path portion 81 a refractive index type waveguide, the lowering of the emission efficiency due to providing the optical path portion 81 can be suppressed. Though with the semiconductor laser device 3f according to the present embodiment, the side surface 81c of the optical path portion 81 extends in the direction of enlarging the optical path portion 81 toward the light emitting surface 1a, the side surface 81c may extend along the light emitting surface 1a (that is, θa≈90°). Or, the side surface 81c may be joined to side surface 44g of the main waveguide 44 at an acute angle (that is, θa<90°).

Third Embodiment

Figure 17:
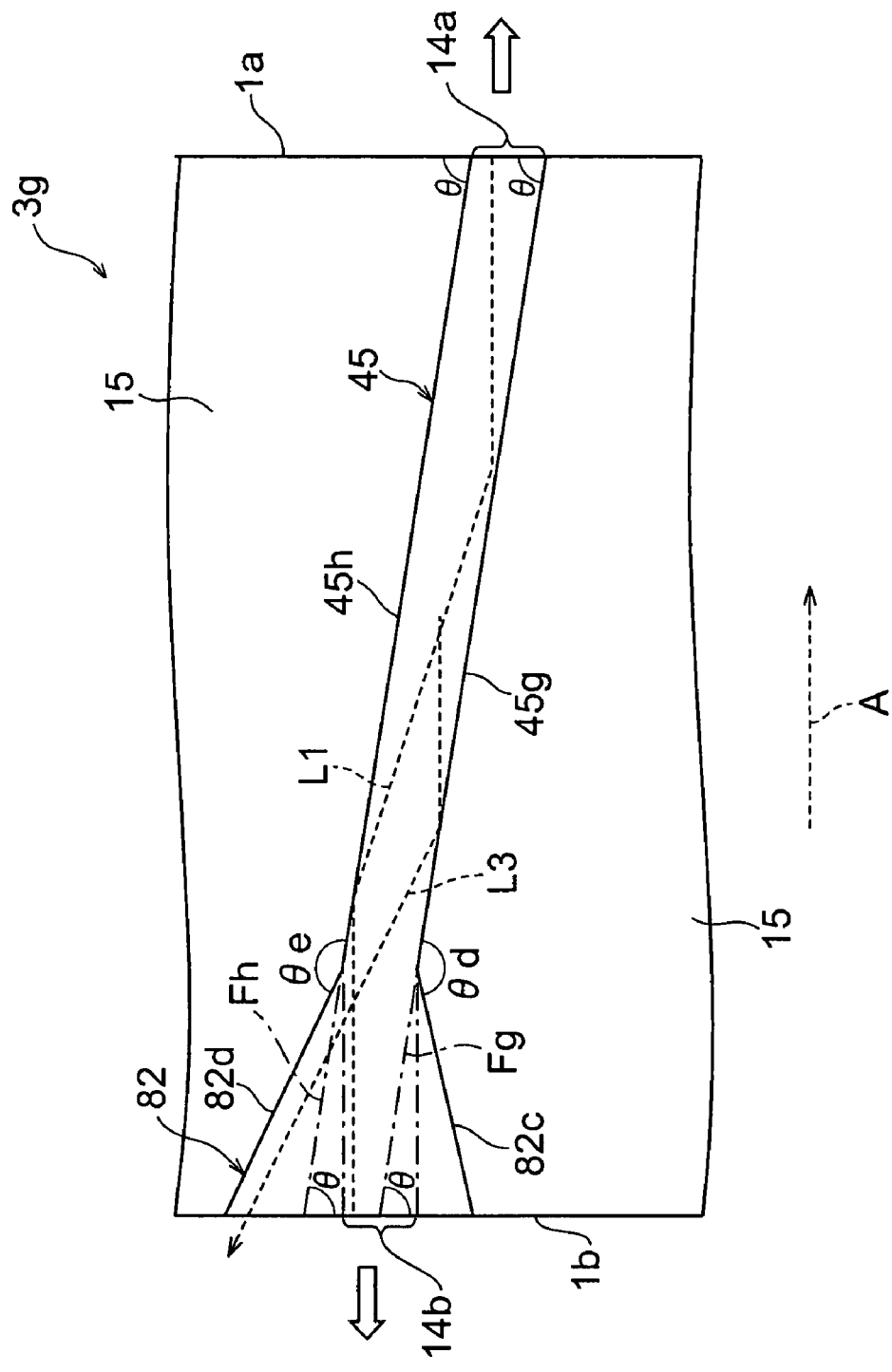
FIG. 17 is a plan view of a waveguide arrangement of a semiconductor laser device of a semiconductor laser device array according to a third embodiment.

A third embodiment of a semiconductor laser device and a semiconductor laser device array according to the present invention shall now be described. FIG. 17 is a plan view of a waveguide arrangement of the semiconductor laser device 3g provided in the semiconductor laser device array according to the present embodiment. The semiconductor laser device 3g of the present embodiment is realized favorably, for example, by a ridge type device arrangement of the same type as the semiconductor laser device 3 of the first embodiment (see (a) in FIG. 2).

Referring to FIG. 17, the semiconductor laser device 3g of the present embodiment has a main waveguide 45 and an optical path portion 82. The main waveguide 45 is a refractive index type waveguide that is formed inside an active layer by a ridge portion provided in a p-type clad layer. The main waveguide 45 has a pair of side surfaces 45g and 45h. The side surfaces 45g and 45h form a relative angle θ with respect to the light emitting surface 1a and the light reflecting surface 1b. One end of each of the side surfaces 45g and 45h reaches the light emitting surface 1a. A region sandwiched by the side surfaces 45g and 45h at the light emitting surface 1a becomes the laser light emitting end 14a, which is one of the resonance end faces for the laser light L1. With the present embodiment, the laser light reflecting end 14b that is the other resonance end face at the light reflecting surface 1b is formed at a region onto which the end of the main waveguide 45 at the light reflecting surface 1b side is projected onto the light reflecting surface 1b.

Also, with the present embodiment, the side surface 45g of the main waveguide 45 is inclined with respect to the predetermined axis A so that an extension line Fg, from the side surface 45g to the light reflecting surface 1b, and the light reflecting surface 1b form an acute angle at an outer side of the main waveguide 45. Also, the side surface 45h of the main waveguide 45 is inclined with respect to the predetermined axis A so that an extension line Fh, from the side surface 45h to the light reflecting surface 1b, and the light reflecting surface 1b form an acute angle at an inner side of the main waveguide 45.

The optical path portion 82 is a refractive index type waveguide that is formed in the interior of the active layer by the ridge portion formed in the p-type clad layer. The optical path portion 82 is disposed between the light reflecting surface 1b and one end of the main waveguide 45 at the side opposite the light emitting surface 1a and has a pair of side surfaces 82c and 82d. One end of the side surface 82c is joined to the other end of the side surface 45g of the main waveguide 45 and the other end of the side surface 82c extends to the light reflecting surface 1b. The side surface 45g of the main waveguide 45 and the side surface 82c of the optical path portion 82 form an angle θd (<180°−θ) at the outer side of the main waveguide 45 and the optical path portion 82. Put in another way, the side surface 82c of the optical path portion 82 is inclined, with respect to a normal to the light reflecting surface 1b, in a direction of enlarging the optical path portion 82 toward the light reflecting surface 1b. Also, one end of the side surface 82d is joined to the other end of the side surface 45h of the main waveguide 45 and the other end of the side surface 82d extends to the light reflecting surface 1b. The side surface 45h of the main waveguide 45 and the side surface 82d of the optical path portion 82 form an angle θe (<180°−θ) at the outer side of the main waveguide 45 and the optical path portion 82. Put in another way, the side surface 82d of the optical path portion 82 forms a relative angle with respect to a normal to the light reflecting surface 1b that is greater than a angle 2(90°−θ) and enlarges the optical path portion 82 toward the light reflecting surface 1b.

Actions of the semiconductor laser device 3g according to the present embodiment are as follows. The laser light L1, which is reflected substantially perpendicularly along the direction of the predetermined axis A at the laser light reflecting end 14b, passes through the optical path portion 82, is made incident onto the side surface 45h of the main waveguide 45 at the incidence angle θ and is totally reflected thereby. The laser light L1 is then made incident on the side surface 45g at the incidence angle θ and is totally reflected thereby. Thereafter, the laser light L1 propagates along the direction of the predetermined axis A and reaches the laser light emitting end 14a. A part of the laser light L1 that reaches the laser light emitting end 14a is transmitted through the laser light emitting end 14a and is emitted to the exterior. The other part of the laser light L1 is reflected substantially perpendicularly along the direction of the predetermined axis A at the laser light emitting end 14a, is totally reflected at the side surfaces 45g and 45h again, and returns to the laser light reflecting end 14b. The laser light L1 thus reciprocates and resonates between the laser light emitting end 14a and the laser light reflecting end 14b.

Because the side surface 82d of the optical path portion 82 forms the angle θe (<180°−θ) with the side surface 45h of the main waveguide 45, the light L3, which, among the light that passes through the interior of the optical path portion 82, deviates from the direction of the predetermined axis A, is not made incident on the side surface 82d of the optical path portion 82 and reaches a region of the light reflecting surface 1b that differs from the laser light reflecting end 14b. A large part of the light L3 passes through the light reflecting surface 1b and is emitted to the exterior of the semiconductor laser device 3g and does not contribute to laser oscillation in the interior of the semiconductor laser device 3g. The light L3 that is reflected at the light reflecting surface 1b is made incident at a low incidence angle onto the side surface 82d of the optical path portion 82 and is transmitted through the side surface 82d and thus does not contribute to the laser oscillation inside the semiconductor laser device 3g.

Thus, with the semiconductor laser device 3g of the present embodiment, the side surface 82d of the optical path portion 82 is arranged so that the light L3 that deviates from the direction of the predetermined axis A in the optical path portion 82 is released from a region of the light reflecting surface 1b that differs from the resonance end face (laser light reflecting end 14b) for the laser light L1. Because the resonance of the light L3 that constitutes a side peak can thus be suppressed at the optical path portion 82, side peaks in the far-field pattern can be reduced effectively. Just one of either the optical path portion 81 of the second embodiment or the optical path portion 82 of the present embodiment may be provided or both optical path portions 81 and 82 may be provided.

Fourth Embodiment

Figure 18:
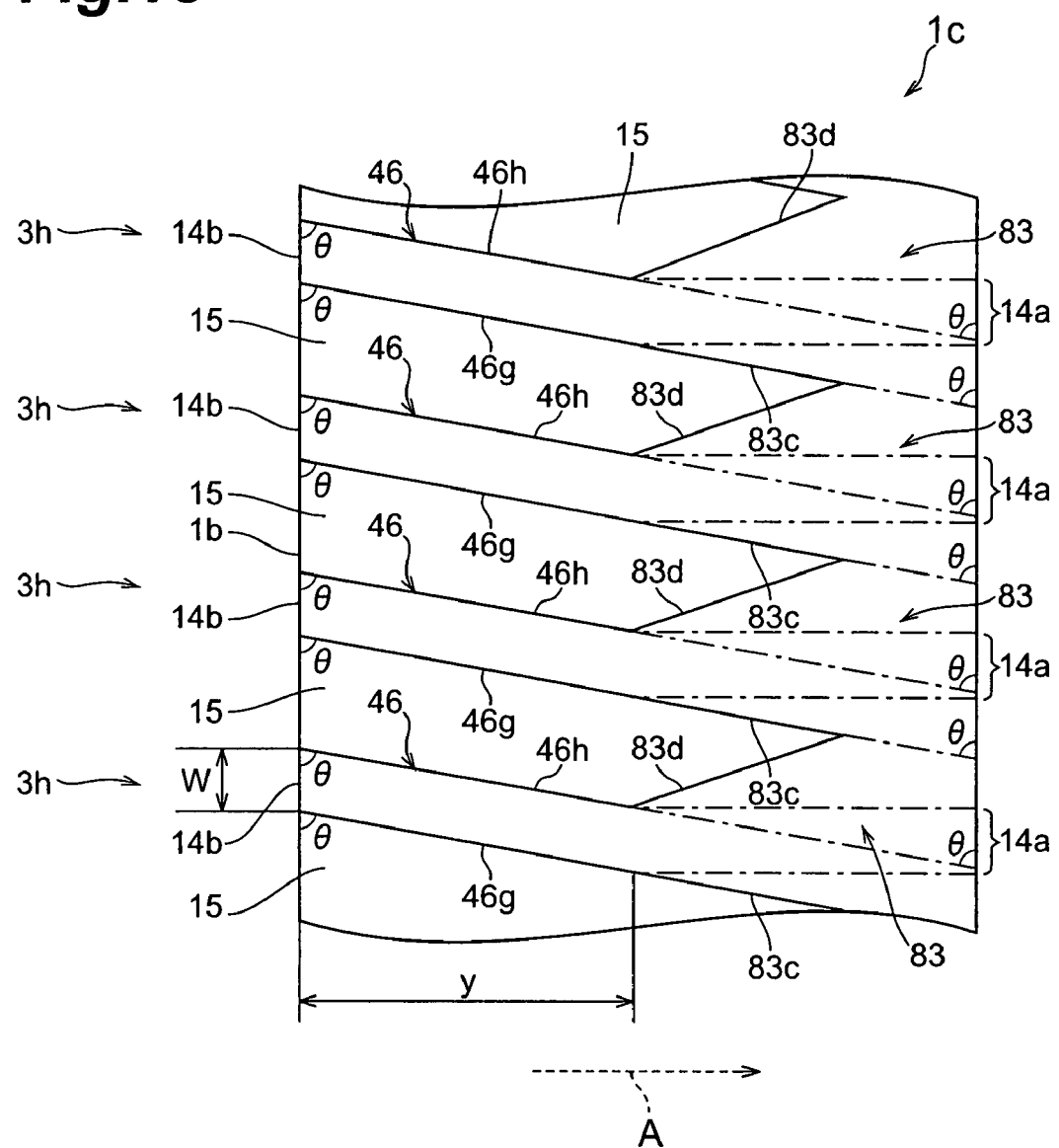
FIG. 18 is a plan view of a waveguide arrangement of a semiconductor laser device array according to a fourth embodiment.

A fourth embodiment of a semiconductor laser device array according to the present invention shall now be described. FIG. 18 is a plan view of a waveguide arrangement of the semiconductor laser device array 1c according to the present embodiment. The semiconductor laser device array 1c has a plurality of semiconductor laser devices 3h. The semiconductor laser device 3h of the present embodiment is realized favorably, for example, by a ridge type device arrangement of the same type as the semiconductor laser device 3 of the first embodiment (see (a) in FIG. 2).

Referring to FIG. 18, each semiconductor laser device 3h of the present embodiment has a main waveguide 46 and an optical path portion 83. The main waveguide 46 is a refractive index type waveguide that is formed inside an active layer by a ridge portion provided in a p-type clad layer. The main waveguide 46 has a pair of side surfaces 46g and 46h. The side surfaces 46g and 46h form a relative angle θ with respect to the light emitting surface 1a and the light reflecting surface 1b. One end of each of the side surfaces 46g and 46h reaches the light reflecting surface 1b. A region sandwiched by the side surfaces 46g and 46h at the light reflecting surface 1b becomes the laser light reflecting end 14b, which is one of the resonance end faces for the laser light L1. With the present embodiment, the laser light emitting end 14a that is the other resonance end face at the light emitting surface 1a is formed at a region onto which the end of the main waveguide 46 at the light emitting surface 1a side is projected onto the light emitting surface 1a.

The optical path portion 83 is disposed so as to extend between the light emitting surface 1a and one end of the main waveguide 46 at the side opposite the light reflecting surface 1b, and a portion thereof constitutes a refractive index type waveguide by a pair of side surfaces 83c and 83d. One end of the side surface 83c is joined to the other end of the side surface 46g of the main waveguide 46. The other end of the side surface 83c extends to the light reflecting surface 1b and is separated from the light reflecting surface 1b by a predetermined distance. In the present embodiment, a relative angle of the side surface 83c of the optical path portion 83 with respect to the light emitting surface 1a is the same as a relative angle θ of the side surface 46g of the main waveguide 46. Also, one end of the side surface 83d of the optical path portion 83 is joined to the other end of the side surface 46h of the main waveguide 46. The other end of the side surface 83d extends to the light reflecting surface 1b and is separated from the light reflecting surface 1b by a predetermined distance. In the present embodiment, the side surface 83d extends in a direction of enlarging the optical path portion 83 toward the light emitting surface 1a and the other end thereof is joined to the other end of the side surface 83c of an adjacent optical path portion 83. Thus, of the plurality of semiconductor laser devices 3h, the optical path portions 83 of adjacent semiconductor laser devices 3h are joined to each other and made integral near the light emitting surface 1a.

The semiconductor laser device array and the semiconductor laser device according to the present invention is realized favorably by the arrangement of the semiconductor laser device array 1c and the semiconductor laser device 3h of the present embodiment as well. That is, light deviating from the direction of the predetermined axis A in the optical path portion 83 is emitted to the exterior from the portion at which the optical path portions 83 are joined to each other (that is, a portion at which a waveguide side surface is not present) and through a region differing from the laser light emitting end 14a and does not resonate. With the semiconductor laser device array and the semiconductor laser device according to the present invention, a portion of the optical path portion 83 does not have to have a waveguide structure as in the semiconductor laser device 3h and it is sufficient that the main waveguide 46 of a required length be provided. The required length y of the main waveguide 46 can be expressed as $y \geq W/\tan(90° - \theta)$, where W is a width of the main waveguide 46.

Fifth Embodiment

Figure 19:
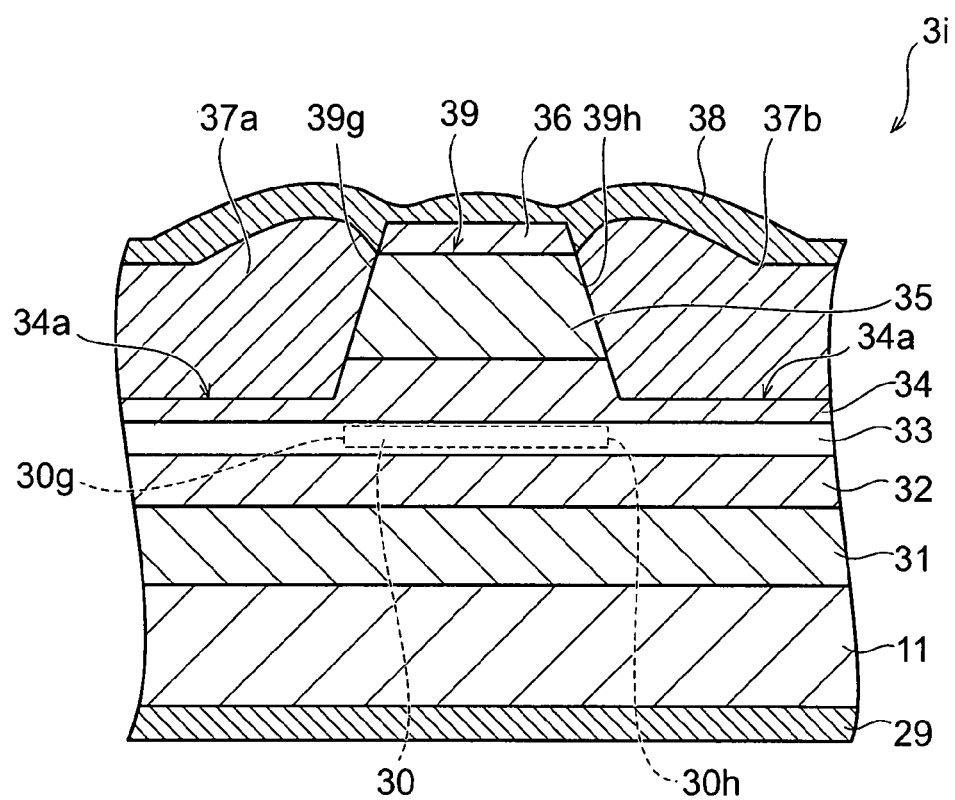
FIG. 19 is a sectional view of a portion of an arrangement of a semiconductor laser device array according to a fifth embodiment.

A fifth embodiment of a semiconductor laser device (semiconductor laser device array) according to the present invention shall now be described. FIG. 19 is a sectional view of a portion of an arrangement of the semiconductor laser device array according to the present embodiment. The section shown in FIG. 19 is a section corresponding to the section taken on line I-I (see FIG. 1) of the semiconductor laser device array 1 according to the first embodiment and is a section of a main waveguide.

The semiconductor laser device array according the present embodiment has a plurality of semiconductor laser devices 3i. Each semiconductor laser device 3i is formed by successively laminating a substrate 11, formed of an n-type semiconductor, an n-type clad layer (second conductive type clad layer) 31, an optical guide layer 32, an active layer 33 with a multi quantum well structure, an optical guide layer 34, a p-type clad layer (first conductive type clad layer) 35, and a p-type cap layer 36. The optical guide layers 32 and 34 are layers for confinement of light in the interior and vicinity of the active layer 33. The optical guide layer 34 and the p-type clad layer 35 constitute a protruding ridge portion 39. The ridge portion 39 is the same in planar shape as the ridge portion 9a of the first embodiment. Regions of the optical guide layer 34 besides the ridge portion 39 are thin portions 34a that are thinner than the ridge portion 39. The p-type cap layer 36 is formed above the ridge portion 39 and is electrically connected to the p-type clad layer 35.

The semiconductor laser device 3i furthermore has current blocking portions 37a and 37b, a p-side electrode layer 38, and the n-side electrode layer 29. Of these, the n-side electrode layer 29 is the same in arrangement as that of the first embodiment. The current blocking portions 37a and 37b are portions for making current flow concentratingly in the ridge portion 39. The current blocking portions 37a and 37b are formed, for example, of a semiconductor of conductive type opposite that of the p-type clad layer 35 or of an insulating material. The current blocking portions 37a and 37b are disposed above the thin portions 34a and respectively along side surfaces 39g and 39h of the ridge portion 39. The p-side electrode layer 38 is disposed above and across the ridge portion 39 and the current blocking portions 37a and 37b, and contacts the p-type cap layer 36 above the ridge portion 39.

In the active layer 33, by an effective refractive index difference being formed by the ridge portion 39, a refractive index type main waveguide 30, corresponding to the shape of the ridge portion 39, is formed. A relative angle of side surfaces 30g and 30h of the main waveguide 30 with respect to the light emitting surface 1a and the light reflecting surface 1b (see FIG. 1) is determined based on the total reflection critical angle θc at the side surfaces 30g and 30h. In the present embodiment, the total reflection critical angle θc depends on the material composition of the current blocking portions 37a and 37b. That is, the refractive index of the current blocking portions 37a and 37b changes when the material composition of the current blocking portions 37a and 37b is changed. Because the effective refractive index difference at the side surfaces 30g and 30h is thus changed, the total reflection critical angle θc changes. The side surfaces 30g and 30h of the main waveguide 30 are surfaces that result from the refractive index difference between the interior and exterior of the main waveguide 30 and may have a certain, fixed thickness in a case where the refractive index varies continuously.

The refractive index type main waveguide according to the present invention is not restricted to a ridge type arrangement such as that in the first embodiment and can be realized favorably with an arrangement such as that of the semiconductor laser device 3*i* of the present embodiment. If refractive index type waveguides are to be formed in the optical path portions according to the present invention as well, a sectional structure, such as that shown in FIG. 19, is also applied to the peripheral structure of the optical path portions.

Sixth Embodiment

Figure 20:
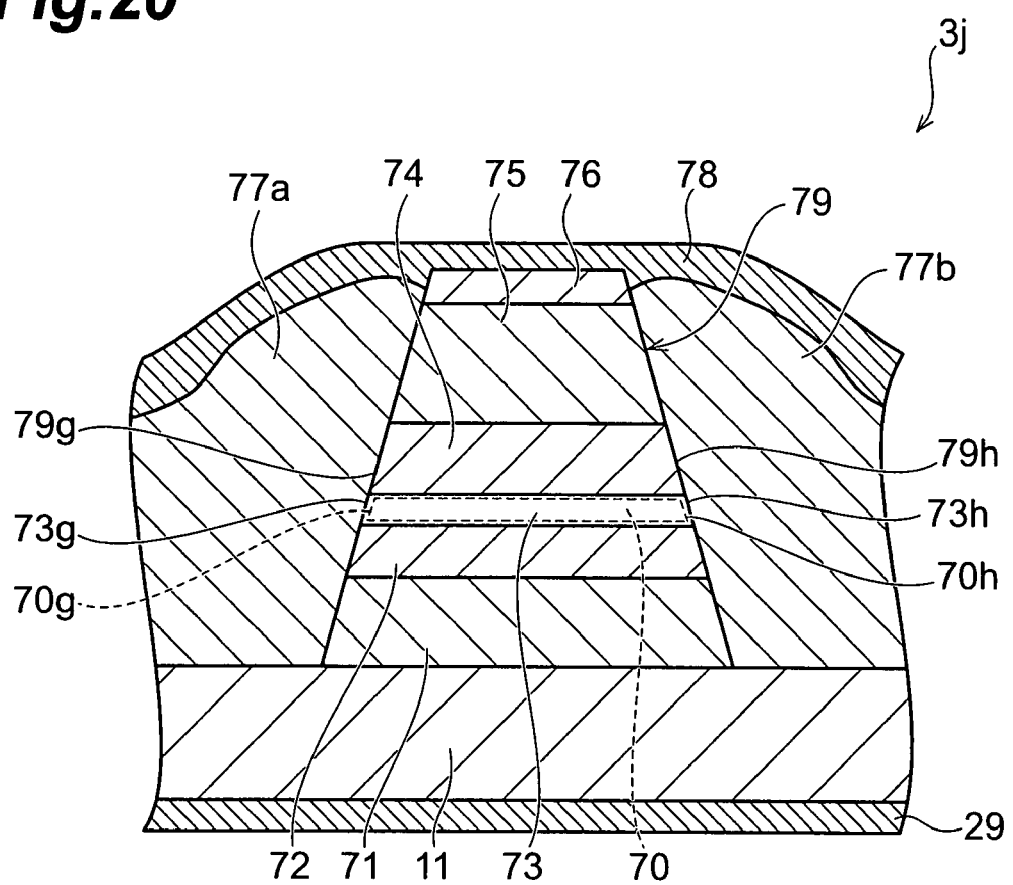
FIG. 20 is a sectional view of a portion of an arrangement of a semiconductor laser device array according to a sixth embodiment.

A sixth embodiment of a semiconductor laser device (semiconductor laser device array) according to the present invention shall now be described. FIG. 20 is a sectional view of a portion of an arrangement of the semiconductor laser device array according to the present embodiment. The semiconductor laser device array of the present embodiment is constituted of a plurality of semiconductor laser devices 3*j*, each having a so-called buried hetero structure.

Referring to FIG. 20, the semiconductor laser device 3*j* of the present embodiment has the substrate 11, formed of an n-type semiconductor. The semiconductor laser device 3*j* also includes an n-type clad layer 71, an optical guide layer 72, an active layer 73, an optical guide layer 74, a p-type clad layer 75, and a p-type cap layer 76. These layers are laminated successively above the substrate 11 to form a laminate 79. The laminate 79 has the same planar shape as the planar shape of ridge portion 9*a* of the first embodiment. The laminate 79 has a pair of side surfaces 79*g* and 79*h*. The active layer 73 has side surfaces 73*g* and 73*h*, which are respectively included in the side surfaces 79*g* and 79*h* of the laminate 79.

The semiconductor laser device 3*j* also has current blocking portions 77*a* and 77*b*, a p-side electrode layer 78, and the n-side electrode layer 29. Of these, the n-side electrode layer 29 is the same in arrangement as that of the first embodiment. The current blocking portions 77*a* and 77*b* are portions for making current flow in a narrowed manner for the active layer 73. The current blocking portions 77*a* and 77*b* are formed, for example, of an undoped semiconductor material or an insulating material. The current blocking portion 77*a* is disposed above the substrate 11 and along the side surface 79*g* of the laminate 79 (that is, along the side surface 73*g* of the active layer 73). The current blocking portion 77*b* is disposed above the substrate 11 and along the side surface 79*h* of the laminate 79 (that is, along the side surface 73*h* of the active layer 73). The p-side electrode layer 78 is disposed above and across the laminate 79, the current blocking portion 77*a*, and the current blocking portion 77*b*, and contacts the p-type cap layer 76 above the laminate 79.

In the active layer 73, by an refractive index difference being formed between the interior and exterior of the active layer at the side surfaces 73*g* and 73*h*, a main waveguide 70 is formed. The main waveguide 70 has a pair of side surfaces 70*g* and 70*h*, respectively defined by the side surfaces 73*g* and 73*h* of the active layer 73. A relative angle θ of the side surfaces 70*g* and 70*h* of the main waveguide 70 with respect to the light emitting surface 1*a* and the light reflecting surface 1*b* (that is, the relative angle θ of the side surfaces 73*g* and 73*h* of the active layer 73 with respect to the light emitting surface 1*a* and the light reflecting surface 1*b*) is determined based on the total reflection critical angle θc at the side surfaces 70*g* and 70*h*. In the present embodiment, the total reflection critical angle θc depends on the refractive index difference of the current blocking portions 77*a* and 77*b* with respect to the active layer 73. This refractive index difference can be set as suited by adjusting the material composition of the current blocking portions 77*a* and 77*b*.

The refractive index type main waveguide according to the present invention can be realized favorably with a buried arrangement such as that of the semiconductor laser device 3*j* of the present embodiment. If refractive index type waveguides are to be formed in the optical path portions according to the present invention as well, a sectional structure, such as that shown in FIG. 20, is also applied to the peripheral structure of the optical path portions.

Seventh Embodiment

Figure 21:
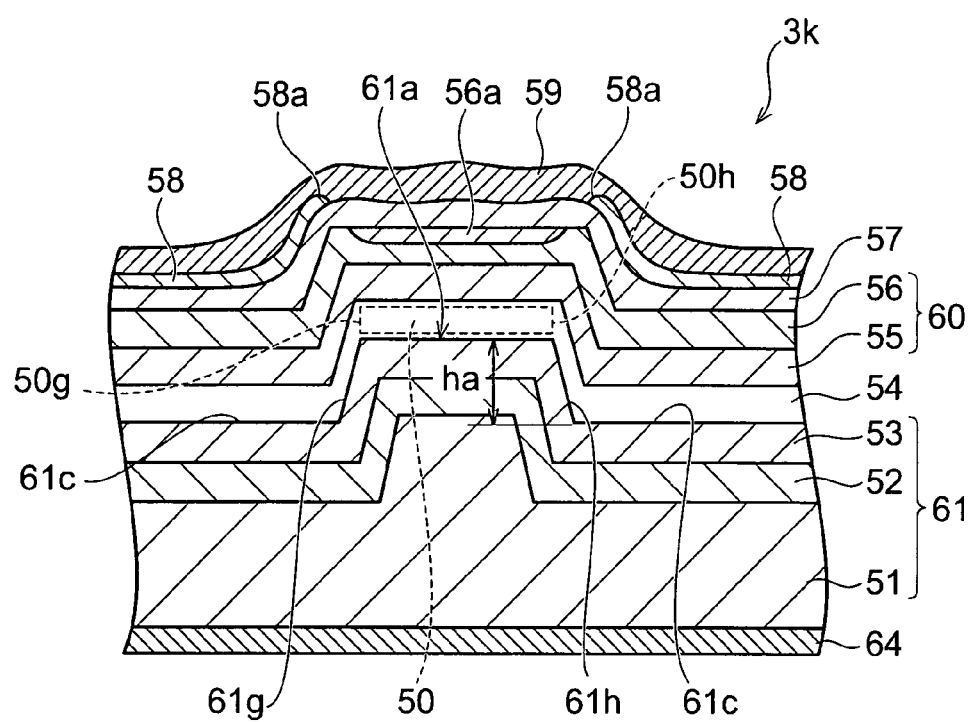
FIG. 21 is a sectional view of a portion of an arrangement of a semiconductor laser device array according to a seventh embodiment.

A seventh embodiment of a semiconductor laser device array according to the present invention shall now be described. FIG. 21 is a sectional view of a portion of an arrangement of the semiconductor laser device array according to the present embodiment. The semiconductor laser device array of the present embodiment has a plurality of semiconductor laser devices 3*k*. Each semiconductor laser device 3*k* has a second semiconductor portion 61. The second semiconductor portion 61 includes a substrate 51, formed of an n-type semiconductor, an n-type clad layer 52, laminated above the substrate 51, and an optical guide layer 53, laminated above the n-type clad layer 52. The second semiconductor portion 61 also has principal surfaces 61*c* on a top surface of the optical guide layer 53.

The second semiconductor portion 61 has a protruding ridge portion 61*a*. The ridge portion 61*a* has the same planar shape as the ridge portion 9*a* (see FIG. 3) of the first embodiment. The ridge portion 61*a* is formed at a position at which it partitions the principal surfaces 61*c*. The ridge portion 61*a* has a pair of side surfaces 61*g* and 61*h* that are boundaries between the principal surfaces 61*c* and the ridge portion 61*a*.

The semiconductor laser device 3*k* also includes a first semiconductor portion 60, an active layer 54, positioned between the first semiconductor portion 60 and the second semiconductor portion 61, and a p-type cap layer 57. The first semiconductor portion 60 includes an optical guide layer 55 and a p-type clad layer 56. The active layer 54, the optical guide layer 55, the p-type clad layer 56, and the p-type cap layer 57 are laminated successively above the second semiconductor portion 61 including the ridge portion 61*a*.

The semiconductor laser device 3*k* also has an insulating film 58, a p-side electrode layer 59, and an n-side electrode layer 64. The p-side electrode layer 59 is disposed above the p-type cap layer 57, and the insulating film 58 is disposed between the p-side electrode layer 59 and the p-type cap layer 57. In the insulating film 58, an opening 58*a* is formed in a region corresponding to the ridge portion 61*a* of the second semiconductor portion 61, and the p-side electrode layer 59 and the p-type cap layer 57 are put in contact with each other via the opening 58*a*. A region of the p-type clad layer 56 that corresponds to the opening 58*a* of the insulating film 58 is arranged as a low resistance region 56*a* by the diffusion of Zn. The opening 58*a* and the low resistance region 56*a* are means for making current concentrate in a region of the active layer 54 above the ridge portion 61*a*. The n-side electrode layer 64 is disposed on a surface of the substrate 51 at the side opposite the principal surfaces 61*c*.

In the active layer 54, by current being made to flow concentratingly in the region corresponding to the opening 58*a* of the insulating film 58 (that is, the region corresponding to the ridge portion 61*a*), a refractive index type main waveguide 50, corresponding to the shape of the ridge portion 61*a*, is formed. The main waveguide 50 has a pair of side surfaces 50*g* and 50*h*. The side surfaces 50*g* and 50*h* of the main waveguide 50 are surfaces formed by the refractive index difference of the active layer 54 with respect to the optical guide layer 55 and the p-type clad layer 56 that cover the active layer 54 and the planar shape thereof is defined by the side surfaces 61g and 61h of the ridge portion 61a. When the refractive index varies continuously at the optical guide layer 55 and the p-type clad layer 56, each of the side surfaces 50g and 50h of the main waveguide 50 may have a certain, fixed thickness.

A relative angle θ of the side surfaces 50g and 50h of the main waveguide 50 with respect to the light emitting surface 1a and the light reflecting surface 1b (see FIG. 1) is determined based on the total reflection critical angle θc at the side surfaces 50g and 50h. In the present embodiment, the total reflection critical angle θc at the side surfaces 50g and 50h depends on the respective heights ha of the side surfaces 61g and 61h of the ridge portion 61a that correspond to the side surfaces 50g and 50h. The total reflection critical angle θc at the side surfaces 50g and 50h of the main waveguide 50 also depends on the material compositions of the optical guide layer 55 and the n-type clad layer 56 above the ridge portion 61a. The total reflection critical angle θc at the side surfaces 50g and 50h can thus be adjusted by adjusting the respective heights ha of the side surfaces 61g and 61h of the ridge portion 61a and the material compositions of the optical guide layer 55 and the n-type clad layer 56.

The refractive index type main waveguide according to the present invention can be realized favorably by an arrangement such as that of the semiconductor laser device 3k of the present embodiment as well. If refractive index type waveguides are to be formed in the optical path portions according to the present invention as well, a sectional structure, such as that shown in FIG. 21, is also applied to the peripheral structure of the optical path portions.

Figure 22:
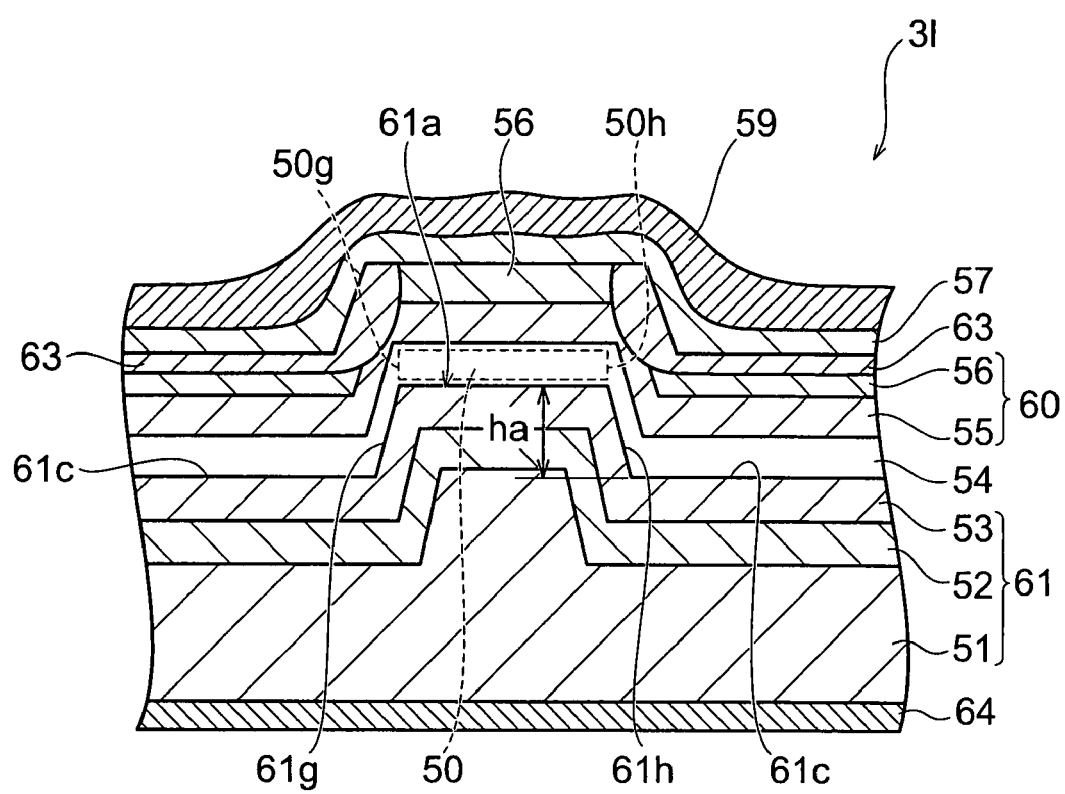
FIG. 22 is a sectional view of an arrangement of a modification example of the semiconductor laser device according to the seventh embodiment.

FIG. 22 is a sectional view of an arrangement of a semiconductor laser device 3l, which is a modification example of the semiconductor laser device 3k. The semiconductor laser device 3l of the present modification example differs from the semiconductor laser device 3k of the above-described embodiment in the arrangement of the current concentrating means. The semiconductor laser device 3l of the present modification example does not have the insulating film 58 of the above-described embodiment, and the low resistance region 56a is not formed in the p-type clad layer 56. In place of these current concentrating means, high resistance regions 63 are formed in the semiconductor laser device 3l of the present modification example. The high resistance regions 63 are formed at the p-type cap layer 57 side of regions of the first semiconductor portion 60 besides the ridge portion 61a. The high resistance regions 63 are formed, for example, by injecting protons into the first semiconductor portion 60. In the semiconductor laser device 3l of the present modification example, by the high resistance regions 63, which are the current concentrating means, concentrating the current in a region of the active layer 54 above the ridge portion 61a, the main waveguide 50 is formed in the active layer 54.

With the semiconductor laser device 3l of the present modification example, the total reflection critical angle θc at the side surfaces 50g and 50h of the main waveguide 50 depends, as in the semiconductor laser device 3k of the above-described embodiment, on the heights ha of the side surfaces 61g and 61h of the ridge portion 61a. The total reflection critical angle θc at the side surfaces 50g and 50h of the main waveguide 50 also depends on the material compositions of the optical guide layer 55 and the n-type clad layer 56.

Also, with the present embodiment, the total reflection critical angle θc at the side surfaces 50g and 50h of the main waveguide 50 also depends on the interval between the high resistance regions 63 and the active layer 54. The interval between the high resistance regions 63 and the active layer 54 can be adjusted, for example, by controlling the depth of proton injection into the first semiconductor portion 60.

The semiconductor laser device and the semiconductor laser device array according to the present invention is not restricted to the respective embodiments and modification examples described above and various other modifications are possible. For example, though such semiconductor laser device structures as the ridge type, buried hetero type, etc., were described with the embodiments, the present invention is not restricted thereto and can be applied to any semiconductor laser device or semiconductor laser device array having a refractive index type waveguide. Also, though a GaAs-based semiconductor laser device was described with the embodiments above, the arrangement of the present invention can also be applied to semiconductor laser devices based on other materials, such as GaN, InP, etc.

Here, preferably the semiconductor laser device includes: a first conductive type clad layer; a second conductive type clad layer; an active layer, disposed between the first conductive type clad layer and the second conductive type clad layer; a light emitting surface and a light reflecting surface, disposed so as to oppose each other in a predetermined axial direction; a refractive index type main waveguide, formed in the active layer, having a pair of side surfaces, and making laser light resonate between the light emitting surface and the light reflecting surface; and an optical path portion, disposed at least at one of either between the light emitting surface and one end of the main waveguide or between the light reflecting surface and the other end of the main waveguide, a relative angle θ of the pair of side surfaces of the main waveguide with respect to the light emitting surface and the light reflecting surface is based on a total reflection critical angle θc at the pair of side surfaces, and the optical path portion is arranged in a manner such that light deviating from the predetermined axial direction in the optical path portion is emitted from a region, differing from a resonance end face for the laser light, at least at one surface among the light emitting surface and the light reflecting surface.

With the semiconductor laser device, the optical path portion may be disposed between the light emitting surface and one end of the main waveguide. The resonance of side peak light can thereby be suppressed effectively.

With the semiconductor laser device, at least a portion of the optical path portion may be a gain type waveguide formed in the active layer. Because confinement of light is less stringent at side surfaces of a gain type waveguide than at the side surfaces of the main waveguide, which is a refractive index type waveguide, side peak light, which, among the light passing through the optical path portion, deviates from the predetermined axial direction, is readily released to the exterior of the device from a side surface of the optical path portion (gain type waveguide) and through a region differing from the resonance end face at the light emitting surface or the light reflecting surface. Thus, with this semiconductor laser device, the optical path portion can be formed so that side peak light is emitted from a region, differing from the resonance end face for laser light, at least at one surface among the light emitting surface and the light reflecting surface. Also, by making at least a portion of the optical path portion be a gain type waveguide, the lowering of the emission efficiency due to providing the optical path portion can be suppressed.

Also, with the semiconductor laser device, the optical path portion may have a pair of side surfaces, disposed between the light emitting surface and one end of the main waveguide and forming a refractive index type waveguide, and of the pair of side surfaces of the main waveguide, the side surface at the side, at which an extension line to the light emitting surface and the light emitting surface form an acute angle at an inner side of the main waveguide, may form, with the optical path portion side surface, positioned at the same side as this main waveguide side surface, an angle less than $180°-\theta$ at an outer side of the main waveguide and the optical path portion.

Also, with the semiconductor laser device, the optical path portion may have a pair of side surfaces, disposed between the light reflecting surface and the other end of the main waveguide and forming a refractive index type waveguide, and of the pair of side surfaces of the main waveguide, the side surface at the side, at which an extension line to the light reflecting surface and the light reflecting surface form an acute angle at an inner side of the main waveguide, may form, with the optical path portion side surface positioned at the same side as this main waveguide side surface, an angle less than $180°-\theta$ at an outer side of the main waveguide and the optical path portion.

With each of these semiconductor laser devices, the angle of a side surface of the refractive index type waveguide in the optical path portion is set so that, of the light passing through the optical path portion, side peak light that deviates from the predetermined axial direction reaches the light emitting surface or the light reflecting surface directly without becoming incident on the side surface of the refractive index type waveguide in the optical path portion. A large part of the side peak light reaching the light emitting surface or the light reflecting surface is emitted to the exterior of the semiconductor laser device upon being transmitted through the light emitting surface or light incidence surface and does not contribute to laser oscillation. Thus, with these semiconductor laser devices, by the angles of the side surfaces of the refractive index type waveguides in the optical path portions being set as described above, the optical path portions can be arranged so that side peak light is released from a region, differing from a resonance end face for laser light, at least at one surface among the light emitting surface and the light reflecting surface.

Also, with the semiconductor laser device, the length of the main waveguide and the mutual interval between the pair of side surfaces of the main waveguide may be set so that the light resonating between the light emitting surface and the light reflecting surface in the main waveguide is reflected the same number of times at each of the pair of side surfaces of the main waveguide. By making the resonating light be reflected (totally reflected) the same number of times at each of the pair of side surfaces of the main waveguide, the resonating light can be made incident and reflected favorably along the predetermined axial direction at both the light reflecting surface and the light emitting surface. Also, by making the resonating light be totally reflected at least once at each of the pair of side surfaces of the main waveguide, the formation of an optical path that joins the light emitting surface and the light reflecting surface in a straight line inside the main waveguide can be suppressed. Thus, by this semiconductor laser device, the optical paths of the laser light inside the main waveguide can be restricted favorably.

Also, with the semiconductor laser device, the relative angle $\theta$ of the side surfaces of the main waveguide with respect to the light emitting surface and the light reflecting surface may be in a range of $\theta c \leq \theta \leq \theta c+1°$. Because the optical paths of the resonating laser light can thus be restricted favorably, laser oscillation that is closer to a single-mode can be obtained.

Also, with the semiconductor laser device, the relative angle $\theta$ of the side surfaces of the main waveguide with respect to the light emitting surface and the light reflecting surface may be substantially matched to the total reflection critical angle $\theta c$ at the side surfaces of the main waveguide. The laser oscillation mode can thereby made substantially single.

The semiconductor laser device array includes a plurality of any of the semiconductor laser devices described above, and preferably the plurality of semiconductor laser devices are formed integrally upon being positioned in a direction that intersects the predetermined axial direction. With this semiconductor laser device array, by being provided with the plurality of any of the semiconductor laser devices described above, laser light of high intensity can be emitted and side peaks in the far-field pattern can be reduced.

INDUSTRIAL APPLICABILITY

The present invention can be used to provide a semiconductor laser device and a semiconductor laser device array that can emit laser light of comparatively high intensity and can reduce side peaks.

The invention claimed is:

1. A semiconductor laser device comprising:
   a first conductive type clad layer;
   a second conductive type clad layer;
   an active layer, disposed between the first conductive type clad layer and the second conductive type clad layer;
   a light emitting surface and a light reflecting surface, disposed so as to oppose each other in a predetermined axial direction;
   a refractive index type main waveguide, formed in the active layer, having a pair of side surfaces, and making laser light resonate between the light emitting surface and the light reflecting surface; and
   an optical path portion, disposed at least at one of either between the light emitting surface and one end of the main waveguide or between the light reflecting surface and the other end of the main waveguide, wherein
   a relative angle $\theta$ of the pair of side surfaces of the main waveguide with respect to the light emitting surface and the light reflecting surface is based on a total reflection critical angle $\theta c$ at the pair of side surfaces, and
   the optical path portion is arranged in a manner such that light deviating from the predetermined axial direction in the optical path portion is suppressed in resonance and is emitted from a non-resonance end face region for the resonance suppressed light, differing from a resonance end face region for the laser light which resonates, at least at one surface among the light emitting surface and the light reflecting surface.

2. The semiconductor laser device according to claim 1, wherein the optical path portion is disposed between the light emitting surface and one end of the main waveguide.

3. The semiconductor laser device according to claim 1, wherein at least a portion of the optical path portion is a gain type waveguide formed in the active layer.

4. The semiconductor laser device according to claim 1, wherein the optical path portion has a pair of side surfaces, disposed between the light emitting surface and one end of the main waveguide and forming a refractive index type waveguide, and
   for the side surface of the main waveguide at the side, at which an extension line to the light emitting surface and the light emitting surface form an acute angle at an inner side of an extension of the main waveguide, the optical path portion side surface, positioned at the same side as the main waveguide side surface, forms a relative angle with respect to a normal to the light emitting surface that is greater than an angle 2 (90°−θ) and enlarges the optical path portion toward the light emitting surface.

5. The semiconductor laser device according to claim 1, wherein the optical path portion has a pair of side surfaces, disposed between the light reflecting surface and the other end of the main waveguide and forming a refractive index type waveguide, and for the side surface of the main waveguide at the side, at which an extension line to the light reflecting surface and the light reflecting surface form an acute angle at an inner side of an extension of the main waveguide, the optical path portion side surface, positioned at the same side as the main waveguide side surface, forms a relative angle with respect to a normal to the light reflecting surface that is greater than an angle 2 (90°−θ) and enlarges the optical path portion toward the light reflecting surface.

6. The semiconductor laser device according to claim 1, wherein the length of the main waveguide and the mutual interval between the pair of side surfaces of the main waveguide are set so that light that resonates between the light emitting surface and the light reflecting surface in the main waveguide is reflected the same number of times at each of the pair of side surfaces of the main waveguide.

7. The semiconductor laser device according to claim 1, wherein the relative angle θ of the side surfaces of the main waveguide with respect to the light emitting surface and the light reflecting surface is in a range of $\theta c < \theta < \theta c + 1°$.

8. The semiconductor laser device according to claim 1, wherein the relative angle θ of the side surfaces of the main waveguide with respect to the light emitting surface and the light reflecting surface is substantially matched to the total reflection critical angle θc at the side surfaces of the main waveguide.

9. A semiconductor laser device array comprising: a plurality of the semiconductor laser devices according to claim 1, wherein the plurality of semiconductor laser devices are formed integrally upon being positioned in a direction that intersects the predetermined axial direction.

\* \* \* \* \*